(12) United States Patent
Lee et al.

(10) Patent No.: US 12,158,648 B2
(45) Date of Patent: Dec. 3, 2024

(54) DISPLAY DEVICE AND METHOD FOR CONTROLLING SAME

(71) Applicant: SAMSUNG ELECTRONICS CO., LTD., Suwon-si (KR)

(72) Inventors: Sungsu Lee, Suwon-si (KR); Sungki Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 124 days.

(21) Appl. No.: 18/074,118

(22) Filed: Dec. 2, 2022

(65) Prior Publication Data

US 2023/0095355 A1   Mar. 30, 2023

Related U.S. Application Data

(63) Continuation of application No. PCT/KR2021/004969, filed on Apr. 20, 2021.

(30) Foreign Application Priority Data

Jun. 18, 2020 (KR) ........................ 10-2020-0074079

(51) Int. Cl.
*G02F 1/1333* (2006.01)
*H05K 7/20* (2006.01)

(52) U.S. Cl.
CPC .. *G02F 1/133385* (2013.01); *G02F 1/133331* (2021.01); *H05K 7/20972* (2013.01)

(58) Field of Classification Search
CPC ........ G02F 1/133385; G02F 1/133331; H05K 7/20972
See application file for complete search history.

(56) References Cited

U.S. PATENT DOCUMENTS

| 9,456,525 B2 | 9/2016 | Yoon et al. |
| 9,776,809 B1 | 10/2017 | Naor et al. |

(Continued)

FOREIGN PATENT DOCUMENTS

| JP | 2011-150034 | 8/2011 |
| JP | 2016-161652 | 9/2016 |

(Continued)

OTHER PUBLICATIONS

Office Action dated Apr. 22, 2024, in Korean Application No. 10-2020-0074079.

(Continued)

*Primary Examiner* — Anne M Hines
(74) *Attorney, Agent, or Firm* — STAAS & HALSEY LLP

(57) ABSTRACT

A display device including: a housing including a first vent through which external air is introduced and a second vent through which the introduced external air flows out; a display panel disposed inside the housing and configured to transmit an image forward; a first flow path formed inside the housing; a first blower configured to exchange heat with the display panel and generate an airflow flowing in the first cooling flow path; a second cooling flow path intersecting the first cooling flow path in communication with the first vent and the second vent and formed inside the housing; a second blower configured to generate an airflow flowing in the second cooling flow path; and a heat exchanger positioned behind the display panel, wherein the heat exchanger includes a first channel in which a part of the first cooling flow path is formed and a second channel intersecting the first channel and in which a part of the second cooling flow path is formed.

15 Claims, 18 Drawing Sheets

(56) References Cited

U.S. PATENT DOCUMENTS

| | | | |
|---|---|---|---|
| 10,492,345 B2 | 11/2019 | Kim et al. | |
| 11,206,750 B2 | 12/2021 | Lee et al. | |
| 2014/0184980 A1* | 7/2014 | Onoue | G02F 1/1336 349/58 |
| 2021/0341783 A1* | 11/2021 | Ahn | G02F 1/133314 |

FOREIGN PATENT DOCUMENTS

| | | |
|---|---|---|
| KR | 10-0637442 | 10/2006 |
| KR | 10-2007-0048299 | 5/2007 |
| KR | 10-0747820 | 8/2007 |
| KR | 10-0821746 | 4/2008 |
| KR | 2016-161652 | 9/2016 |
| KR | 10-2018-0046519 | 5/2018 |
| KR | 10-2018-0063689 | 6/2018 |
| KR | 10-2018-0104530 | 9/2018 |
| KR | 10-2018-0128959 | 12/2018 |
| KR | 10-2019-0007906 | 1/2019 |
| KR | 10-2120763 | 6/2020 |
| WO | WO 2019/124682 A1 | 6/2019 |

OTHER PUBLICATIONS

International Search Report dated Aug. 12, 2021, in International Application No. PCT/KR2021/004969.
Written Opinion, PCT/ISA/237, dated Aug. 12, 2021, in International Application No. PCT/KR2021/004969.

* cited by examiner

DISPLAY DEVICE AND METHOD FOR CONTROLLING SAME

CROSS-REFERENCE TO RELATED APPLICATIONS

This application is a continuation application, filed under 35 USC 111(a), of International Application PCT/KR2021/004969, filed Apr. 20, 2021, and claims foreign priority to Korean application 10-2020-0074079, filed Jun. 18, 2020, the disclosures of which are incorporated herein by reference in their entireties.

BACKGROUND

1. Field

The present disclosure relates to a display device, and more particularly, to an outdoor display device having a heat dissipation structure.

2. Description of Related Art

In general, display devices are devices that display images on screens such as televisions, computer monitors, and digital information displays. Recently, such display devices are more often installed outdoors for the purpose of advertisement. Examples thereof include digital signages located outside buildings and displaying images.

As such, in the case where outdoor display devices are directly exposed to sunlight, surface temperature of display panels may increase, resulting deterioration.

In addition, a display device may include a display panel and a backlight unit emitting light to be incident on the rear surface of the display panel. The display panel may include a pair of substrates facing each other with a liquid crystal layer interposed therebetween. The backlight unit may include a light source that emits light to the display panel. Because the light source of the backlight unit not only emits light but also generates heat, the display panel may be deteriorated thereby.

Therefore, a display device may include a heat dissipation structure for preventing the deterioration phenomenon of a display panel.

As the heat dissipation structure, an internal air circulation cooling structure using a convection flow on the front of the display panel may be used. However, because internal air circulates only in one direction in the conventional internal air circulation cooling structure using the convection flow on the front of the display panel, a large temperature deviation occurs. Such a large temperature difference on the front surface may cause sheet wrinkles of an optical sheet inside a display module leading to a problem of deteriorating optical reliability of a display device.

SUMMARY

Aspects of embodiments of the present disclosure will be set forth in part in the description which follows and, in part, will be apparent from the description, or may be learned by practice of the presented embodiments.

In accordance with an aspect of the present disclosure, a display device includes: a housing comprising a first vent through which external air is introduced into the housing and a second vent through which the introduced external air flows out of the housing; a display panel disposed inside the housing; a first cooling flow path formed inside the housing; a first blower configured to exchange heat with the display panel and generate an airflow flowing in the first cooling flow path; a second cooling flow path intersecting the first cooling flow path in communication with the first vent and the second vent and formed inside the housing; a second blower configured to generate an airflow flowing in the second cooling flow path; and a heat exchanger disposed behind the display panel, wherein the heat exchanger comprises a first channel in which a part of the first cooling flow path is formed and a second channel intersecting the first channel and in which a part of the second cooling flow path is formed.

An internal region of the housing, when divided into four quadrants based on a rear surface of the display panel, may include a first cooling area, a second cooling area, a third cooling area, and a fourth cooling area sequentially disposed in a counterclockwise direction from an area located at an upper right corner of the internal region, and the display device may include a plurality of temperature sensors disposed behind the display panel and located respectively in the first cooling area, the second cooling area, the third cooling area, and the fourth cooling area.

The first cooling flow path may be formed parallel to a vertical direction of the quadrants.

The first blower may generate a first airflow flowing in the first cooling flow path or a second airflow flowing in the first cooling flow path in the opposite direction to the first airflow.

The display device may further include a cover glass disposed in front of the display panel, spaced apart from the display panel, and coupled to the housing, wherein the first airflow is generated in a form circulating in the order of an upper end of a periphery of the display panel, a space between the front surface of the display panel and the cover glass, a lower end of the periphery of the display panel, and the first channel.

The first blower may be provided in plural and may be disposed behind the display panel, and each of the plurality of first blowers may be disposed close to the upper end of the periphery of the display panel or the lower end of the periphery of the display panel.

The second blower may generate a third airflow flowing in the second cooling flow path or a fourth airflow flowing in the second cooling flow path in the opposite direction to the third airflow.

The second cooling flow path may be formed parallel to a lateral direction of the quadrants, and the first vent and the second vent may be formed at positions corresponding to ends of the second cooling flow path of the housing, respectively.

The first vent may be formed on a side of the first cooling area or the fourth cooling area and the second vent is formed on a side of the second cooling area or the third cooling area, and the third airflow may be generated to flow from the first vent to the second vent through the second channel.

The second blower may be provided in plural, and each of the plurality of second blowers may be disposed close to at least one of the first vent and the second vent.

The display device may further include a controller disposed inside the housing, wherein the controller may control the first blower to generate the first airflow to flow in the first cooling flow path and controls the second blower to generate a third airflow to flow in the second cooling flow path upon determination that a temperature measured by a temperature sensor disposed in the first cooling area is higher than temperatures measured by the other temperature sensors.

The display device may further include a controller disposed inside the housing, wherein the controller may control the first blower to generate a first airflow to flow in the first cooling flow path and controls the second blower to generate a fourth airflow to flow in the second cooling flow path upon determination that a temperature measured by a temperature sensor disposed in the second cooling area is higher than temperatures measured by the other temperature sensors.

The display device may further include a controller disposed inside the housing, wherein the controller may control the first blower to generate a second airflow to flow in the first cooling flow path and controls the second blower to generate a fourth airflow to flow in the second cooling flow path upon determination that a temperature measured by a temperature sensor disposed in the third cooling area is higher than temperatures measured by the other temperature sensors.

The display device may further include a controller disposed inside the housing, wherein the controller may control the first blower to generate a second airflow to flow in the first cooling flow path and controls the second blower to generate a third airflow to flow in the second cooling flow path upon determination that a temperature measured by a temperature sensor disposed in the fourth cooling area is higher than temperatures measured by the other temperature sensors.

The heat exchanger may include a plurality of heat exchange fins partitioning the first channel and the second channel to allow the first channel and the second channel to intersect each other, each of the heat exchange fins may have a C-shaped cross-section, and the heat exchange fins are stacked and coupled to each other by rotating at 90° to constitute the heat exchanger, the housing may further include a guide flange partitioning the first cooling flow path and the second cooling flow path and supporting the heat exchanger, and the guide flange may guide external air introduced through the first vent to the second channel and guide the external air flowing out of the second channel to be discharged through the second vent.

BRIEF DESCRIPTION OF THE DRAWINGS

Aspects, features, and advantages of embodiments of the present disclosure will be more apparent from the following description taken in conjunction with the accompanying drawings, in which.

DETAILED DESCRIPTION

Figure 1:
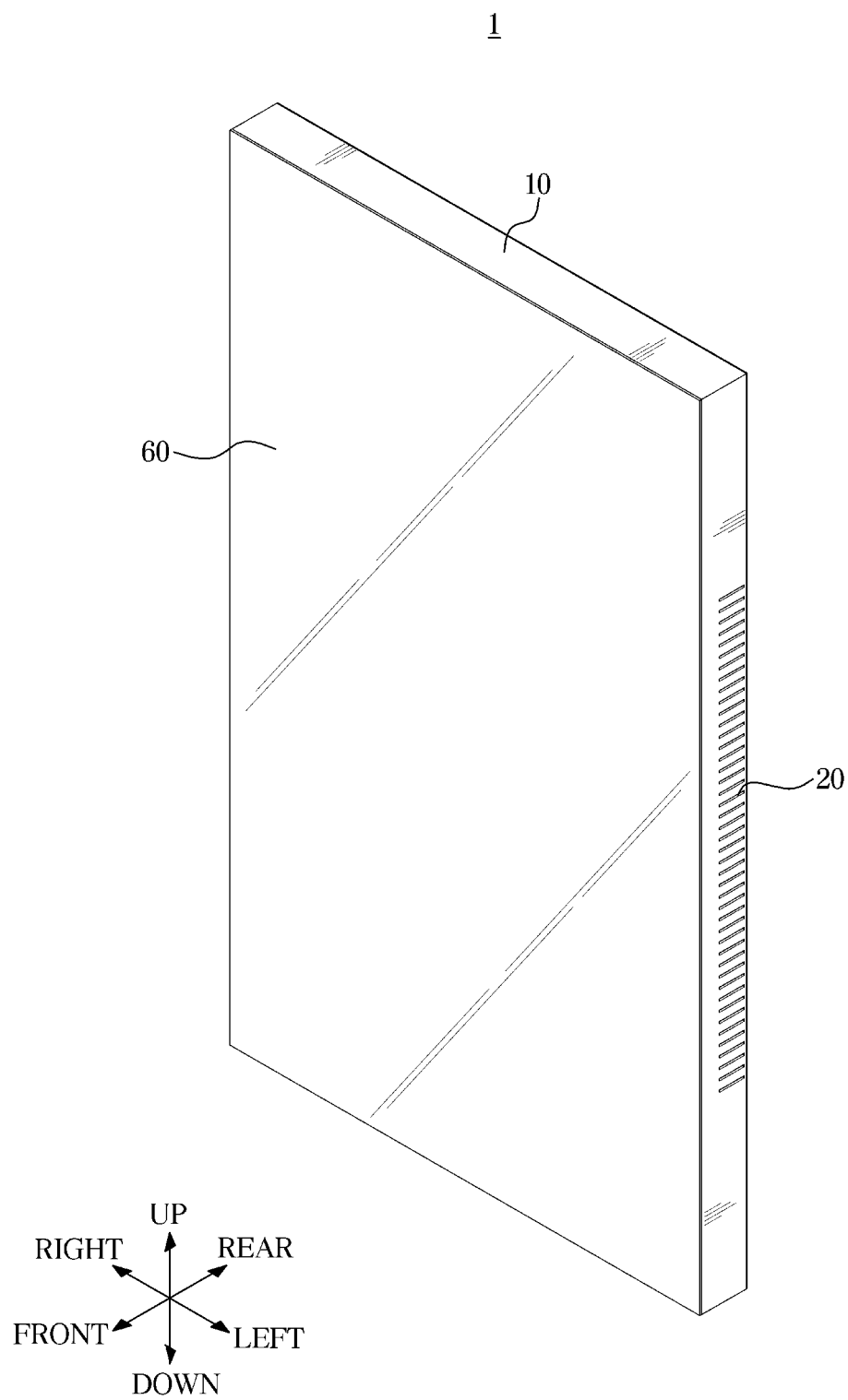
FIG. 1 is a perspective view illustrating a display device according to an embodiment of the present disclosure.

Reference will now be made in detail to the embodiments of the present disclosure, examples of which are illustrated in the accompanying drawings. The embodiments described in the specification and shown in the drawings are only illustrative and are not intended to represent all aspects of the invention, such that various modifications may be made without departing from the spirit of the invention.

Throughout the specification, like reference numerals denote like elements or components having substantially same functions.

The terms used in the present specification are merely used to describe particular embodiments, and are not intended to limit the present disclosure. An expression used in the singular encompasses the expression of the plural unless it has a clearly different meaning in the context. In the present specification, it is to be understood that the terms such as "including" or "having," etc., are intended to indicate the existence of the features, numbers, operations, components, parts, or combinations thereof disclosed in the specification, and are not intended to preclude the possibility that one or more other features, numbers, operations, components, parts, or combinations thereof may exist or may be added.

Content may be displayed on a display device. For example, content may include a video file or audio file reproduced by a video player as one of the applications, a music file reproduced by a music player, a photo file displayed in a photo album application, and a Web page file displayed on a Web browser. Also, content may include a received broadcast.

Content may include a video file, an audio file, a text file, an image file, or a Web page displayed or executed in an application. Also, content may include a video file and/or an audio file included in a received broadcast signal.

In an embodiment of the present disclosure, content received from an external device or content stored in a device may include a broadcast signal, a video file, an audio file, a text file, an image file, or a Web page executed in response to a user input (e.g., touch). In addition, the term "video" may be used in the same meaning as "moving image".

Content may include an executed application screen and a user interface (UI) included in the application screen. Further, the content may include one or more pieces of content.

It will be understood that, although the terms "first", "second", etc., may be used herein to describe various elements, these elements should not be limited by these terms. The above terms are used only to distinguish one component from another. For example, a first component discussed below could be termed a second component, and similarly, the second component may be termed the first component without departing from the teachings of this disclosure. As used herein, the term "and/or" includes any and all combinations of one or more of the associated listed items.

The term 'front' used hereinafter is defined as a direction in which a display panel 110 transmits an image, and 'rear', 'up', 'down', and 'left/right' are defined based thereon.

Meanwhile, as used herein, the terms 'front', 'rear', 'up' and 'down', and the like are defined based on the drawings and the shape and position of each element are not limited by these terms.

According to various embodiments of the present disclosure, provided is a display device capable of increasing cooling efficiency of a display module to prevent deterioration of the display panel.

According to various embodiments of the present disclosure, provided is a display device capable of increasing cooling efficiency of a display module by adjusting a direction of internal air circulation and a direction of an external air flow inside the display device.

According to various embodiments of the present disclosure, provided is a method for controlling a display device capable of effectively adjusting a direction of internal air circulation and a direction of an external air flow inside the display device.

According to an embodiment of the present disclosure, the display device may have an increased cooling efficiency of the display module via indirect heat exchange between internal air circulation that cools the display module and the external air flow introduced into the display device from the outside because the internal air circulation and the external air flow intersect each other.

According to an embodiment of the present disclosure, the display device may provide a uniform cooling effect to the entire area of the display module by inverting the directions of the internal air circulation or the external air flow in the forward direction or reverse direction based on temperature measured at each of the areas of the display panel divided into four quadrants.

According to an embodiment of the present disclosure, the display device may invert the directions of the internal air circulation or the external air flow in the forward direction or reverse direction by controlling the blowers based on temperature measured at each of the areas of the display panel divided into four quadrants. Hereinafter, embodiments of the present disclosure will be described in detail with reference to the accompanying drawings.

Figure 2:
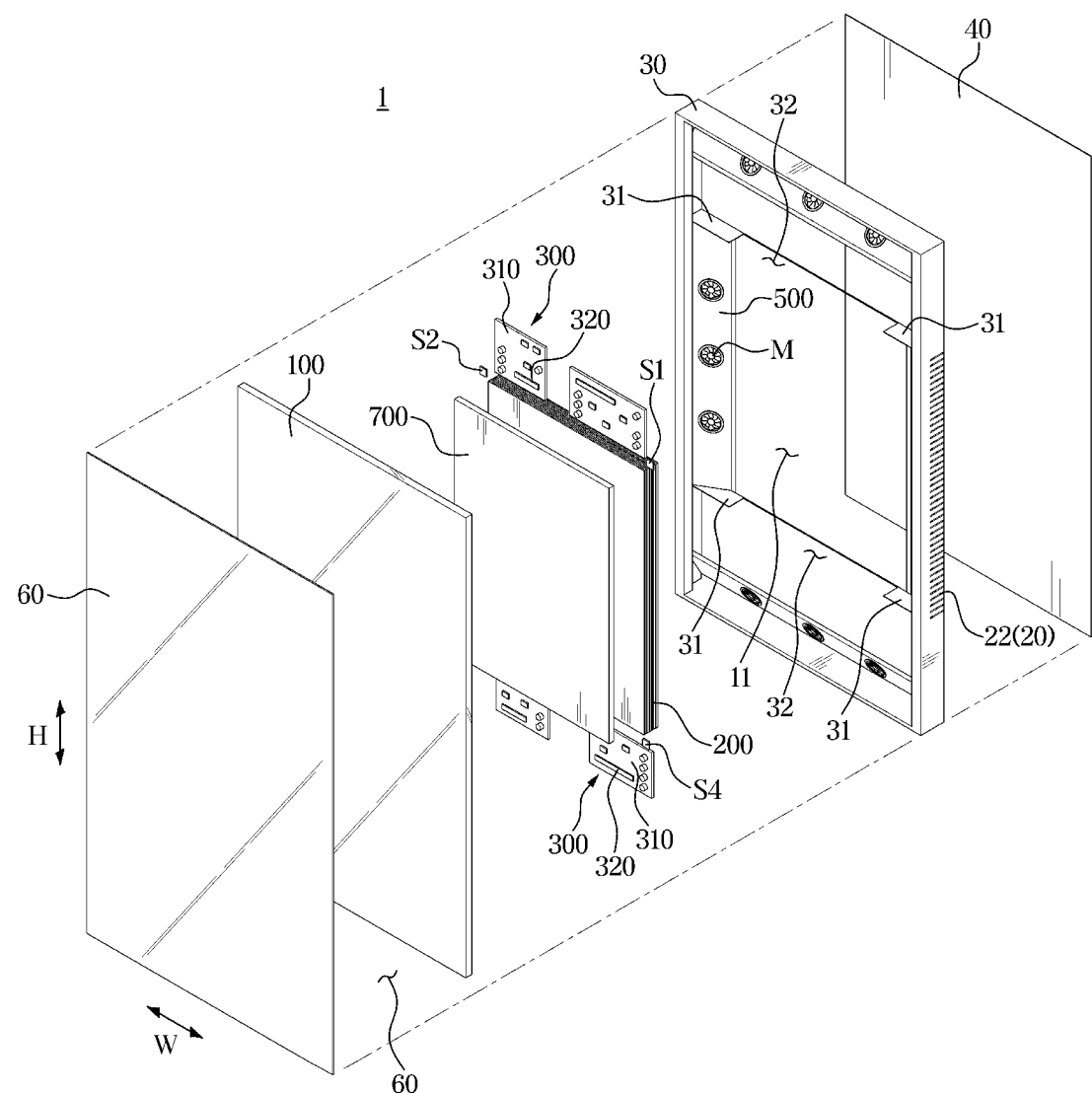
FIG. 2 is an exploded perspective view illustrating the display device shown in FIG. 1.
Figure 3:
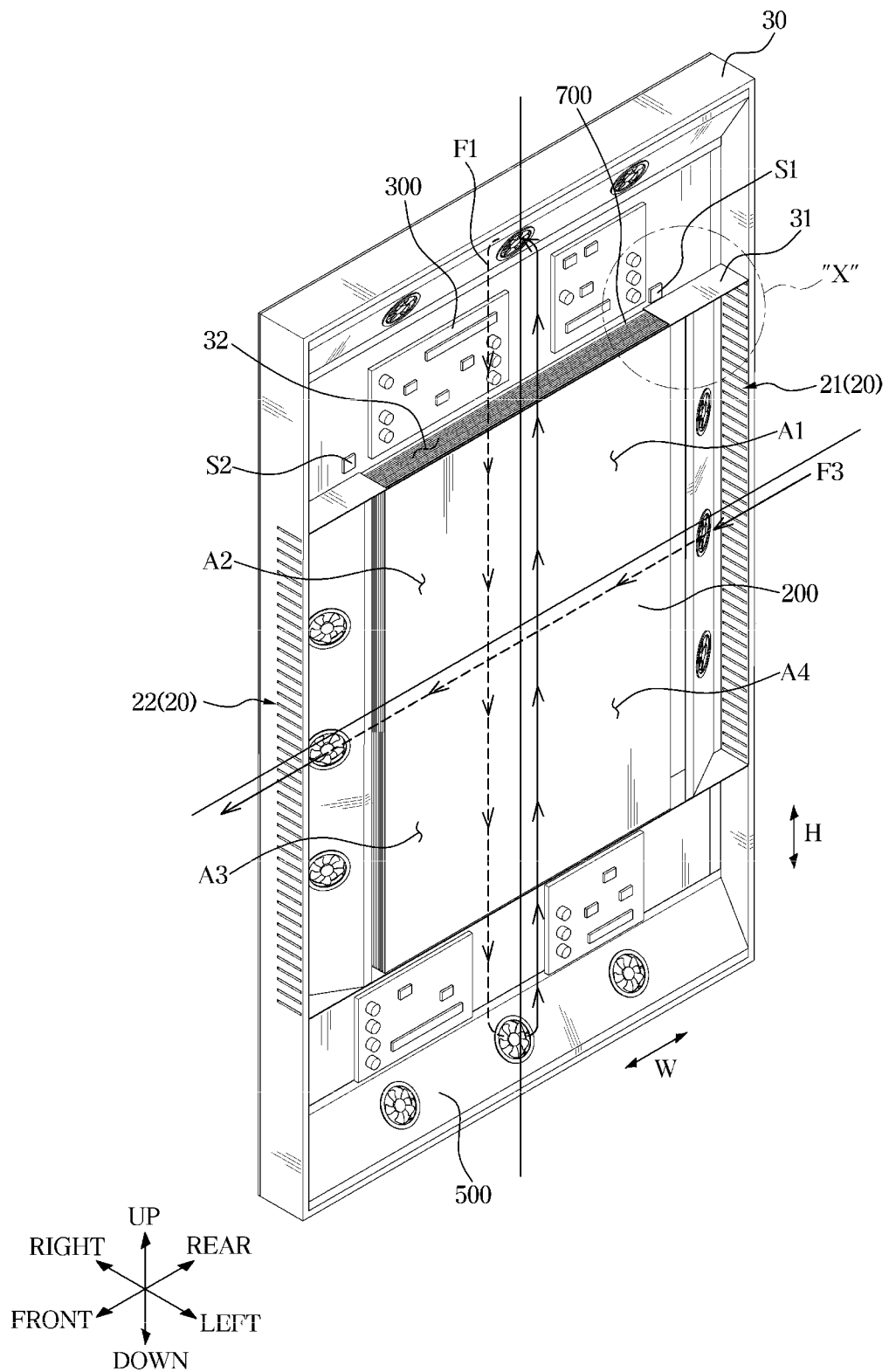
FIG. 3 is a rear perspective view of the display device shown in FIG. 1 in a state where a rear cover is removed.
Figure 4:
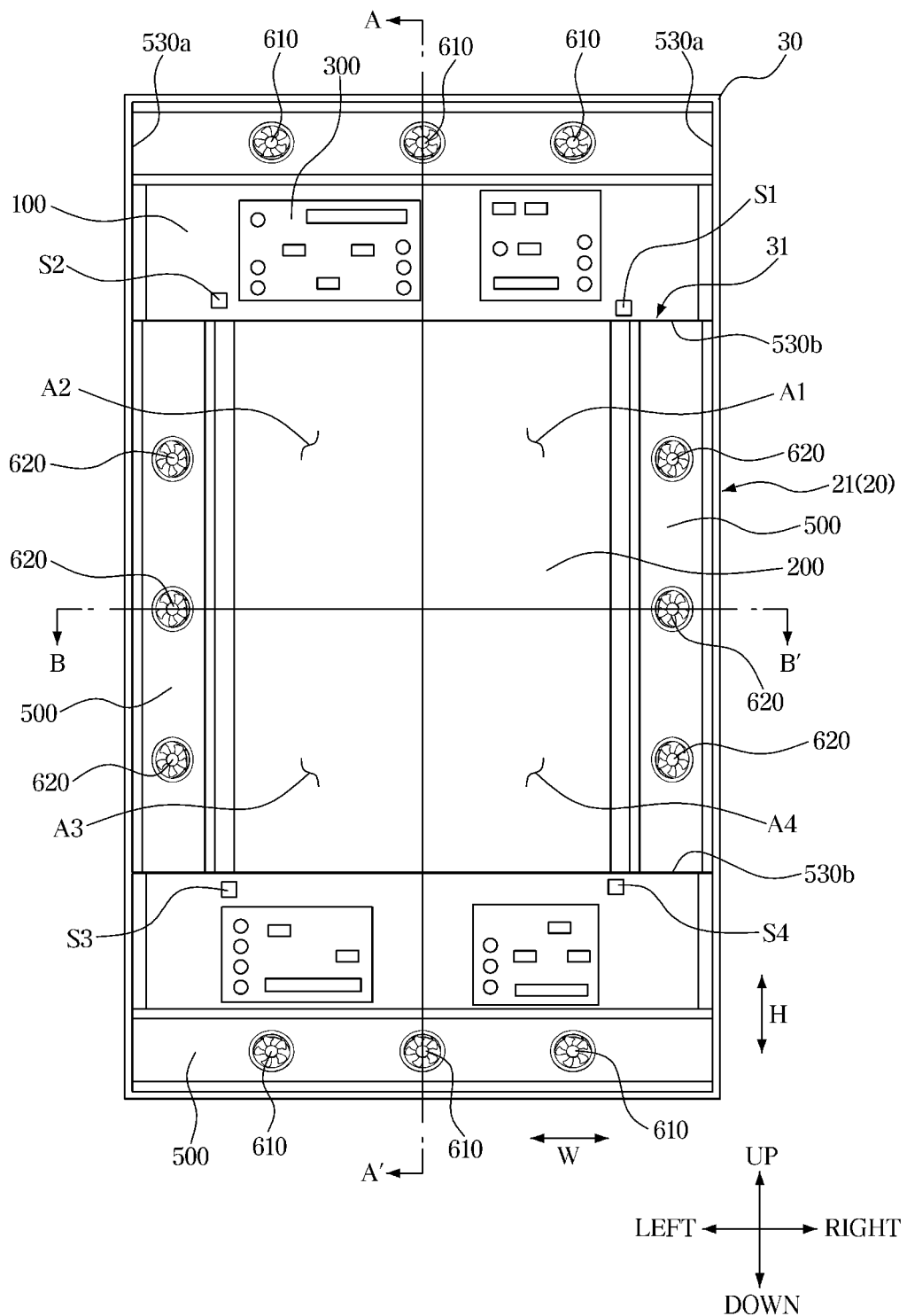
FIG. 4 is a rear view of the display device shown in FIG. 1 in a state where a rear cover is removed.
Figure 5:
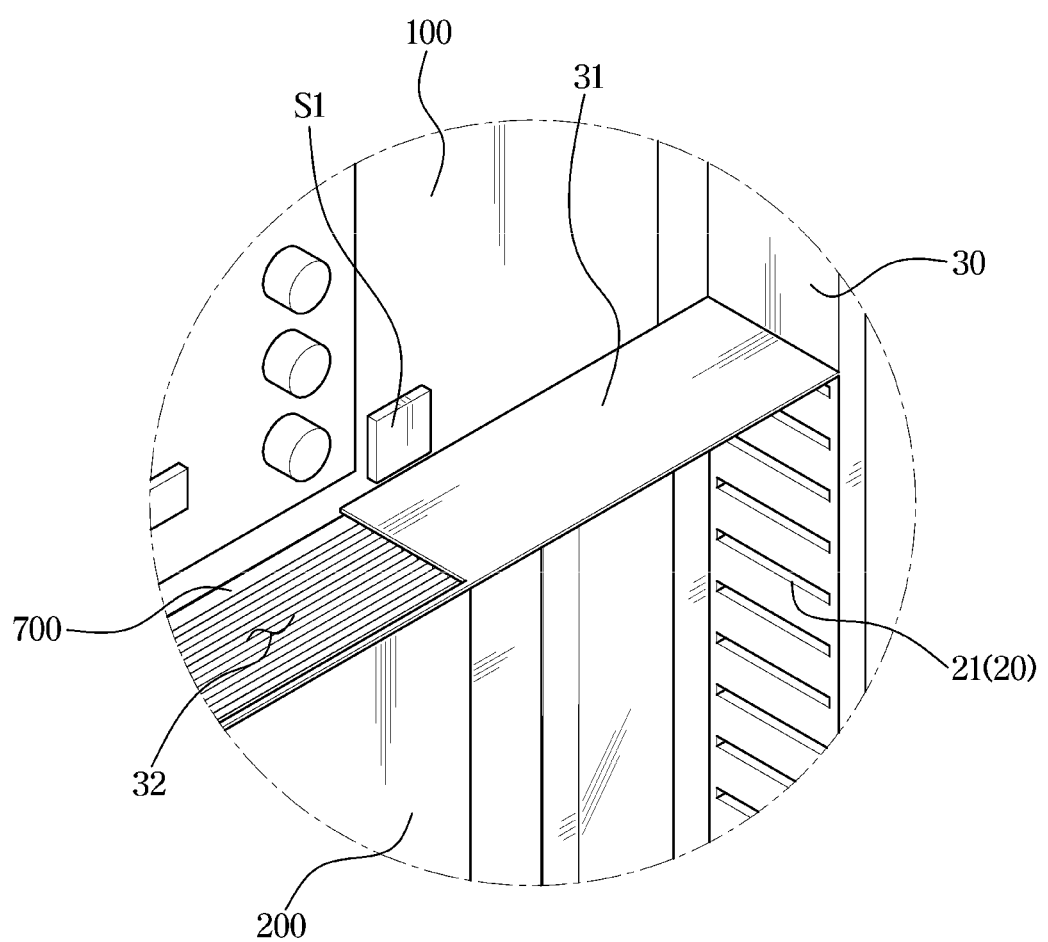
FIG. 5 is an enlarged view illustrating a region A of FIG. 3.
Figure 6:
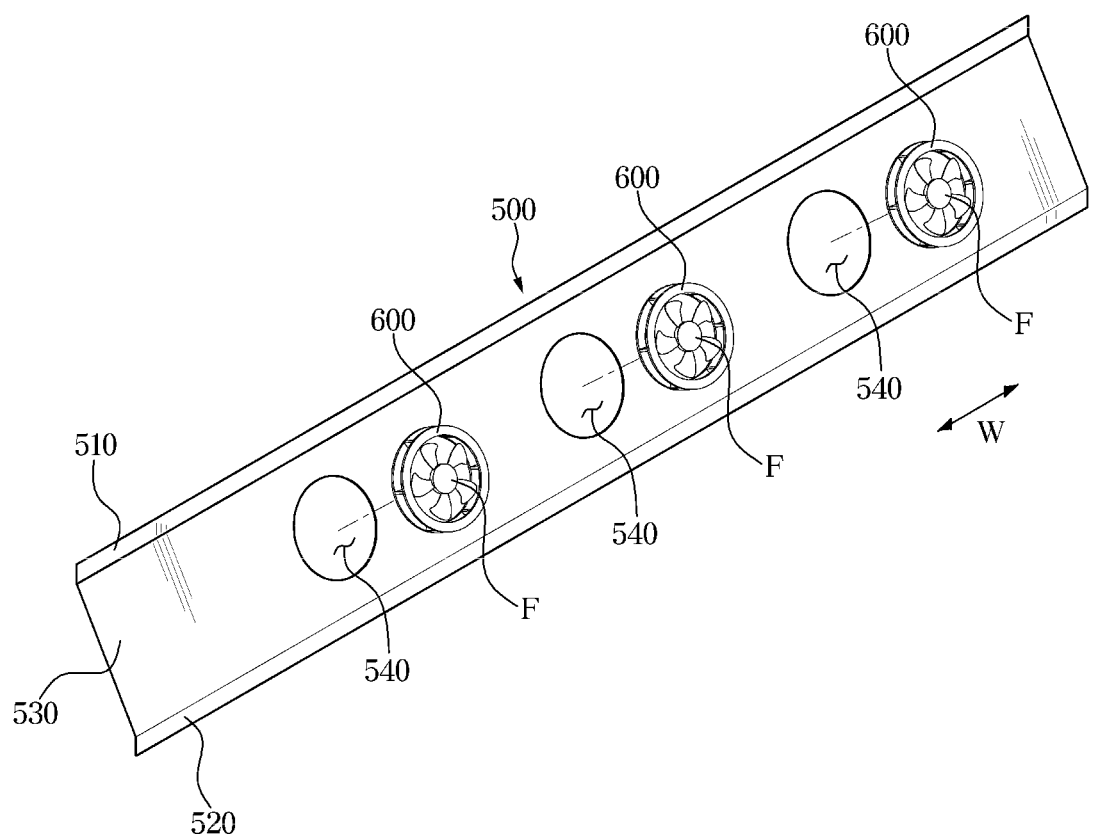
FIG. 6 is a perspective view of a blower fixing plate and a blower of FIGS. 2 and 3.

FIG. 1 is a perspective view illustrating a display device according to an embodiment of the present disclosure. FIG. 2 is an exploded perspective view illustrating the display device shown in FIG. 1. FIG. 3 is a rear perspective view of the display device shown in FIG. 1 in a state where a rear cover is removed. FIG. 4 is a rear view of the display device shown in FIG. 1 in a state where a rear cover is removed. FIG. 5 is an enlarged view illustrating a region A of FIG. 3. FIG. 6 is a perspective view of a blower fixing plate and a blower of FIGS. 2 and 3.

As shown in FIGS. 1 and 2, a display device 1 may include a housing 10 defining an exterior appearance. The housing 10 may be provided to be installed outdoors. The housing 10 may have an opening 11. Specifically, the opening 11 may be formed at the front of the housing 10. In addition, the housing 10 may have a vent 20. The vent 20 may be formed at both sides of the housing 10. The vent 20 may include a first vent 21 and a second vent 22.

As shown in FIGS. 1 to 3, the first vent 21 and the second vent 22 may be formed at both sides of the housing 10. The first vent 21 and the second vent 22 may be formed at both sides of the housing 10 at positions corresponding to each other. The first vent 21 and the second vent 22 may be formed at both sides of the housing 10 in the form of a plurality of slits. The first vent 21 and the second vent 22 may be formed to penetrate the housing 10 allowing the inside of the housing 10 in communication with the outside of the housing 10. External air may be introduced into the housing 10 or the introduced air may flow out of the housing 10 through the first vent 21 and the second vent 22.

The first vent 21 and the second vent 22 may serve as an inlet or an outlet, respectively. The functions of the first vent 21 and the second vent 22 as the inlet or the outlet are not assigned and designated to the respective vents, but may vary in accordance with a flow direction of external air which will be described below. However, the positions of the first vent 21 and the second vent 22 are not limited to those given in the above-described example and the first vent 21 and the second vent 22 may also be formed at a rear cover 40 which will be described below and the positions may vary in various manners.

The housing 10 may include a first frame 30. The first frame 30 may have a box shape with open front and open back. The open front of the first frame 30 may be defined as the opening 11. That is, the opening 11 may be formed at the front of the first frame 30.

The housing 10 may further include a rear cover 40. The rear cover 40 may be coupled to the first frame 30. Specifically, the rear cover 40 may be coupled to the open back of the first frame 30 to define the exterior appearance of the display device 1 together with the first frame 30.

The display device 1 may further include a protective glass 60 arranged to protect the display module 100. The protective glass 60 may be disposed in front of the display module 100 to protect the display module 100. Specifically, the protective glass 60 may be coupled to the opening 11 of the housing 10.

The protective glass 60 may have a size corresponding to a size of the display module 100. Specifically, the protective glass 60 may have a size corresponding to a size of the display panel 110 of the display module 100. More specifically, the protective glass 60 may be disposed to correspond to a display area of the display panel 110 on which an image is displayed.

The display device 1 may further include the display module 100 including the display panel 110 and a backlight unit 120. The display module 100 may display content. The content displayed on the display module 100 may be content received from an external device or content stored therein. The display module 100 may be disposed inside the housing 10. The display module 100 may be disposed inside the housing 10 at a position behind the protective glass 60. In addition, the display module 100 may be disposed inside the housing 10 such that heat is concentrated on the rear surface of the display panel 110 rather than the front surface of the display panel 110. The display panel 110 may be disposed at the front of the display module 100.

The display device 1 may further include a heat exchanger 200. The heat exchanger 200 may be disposed behind the display module 100. The heat exchanger 200 may be coupled to the rear surface of the display module 100 to receive heat from the display module 100 in a heat conduction method.

In another aspect, the heat exchanger 200 may be disposed at the rear surface of the display module 100 such that heat inside the housing 10 is concentrated on the rear surface of the display panel 110. That is, the heat exchanger 200 may be disposed at a rear surface of the display module 100 such that heat inside the housing 10 is concentrated on the rear surface of the display panel 110 and dissipated. In this regard, heat inside the housing 10 may be generated by at least one of the display module 100 and the controller 300. Also, heat inside the housing 10 may be generated by sunlight incident on the display device 1. Heat inside the housing 10 may be concentrated on the heat exchanger 200 by a heat conduction method. The configuration of the heat exchanger 200 will be described below in more detail.

The heat exchanger 200 may be disposed inside the housing 10 at the rear surface of the display module 100, particularly, at a position where a first cooling flow path P1 in which internal air circulates intersects a second cooling flow path P2 in which external air flows which will be described below. In other words, the heat exchanger 200 may be disposed at a position where internal air circulation intersects an external air flow. Such an intersection may be set as a central region of the rear surface of the display module 100. However, the intersection between the internal air circulation and the external air flow is not fixed at the central area of the rear surface of the display module 100 but may be set at various positions allowing efficient heat exchange between the internal air circulation and the external air flow.

The display device 1 may further include a heat transfer member 700. The heat transfer member 700 may be interposed between the display module 100 and the heat exchanger 200. Specifically, the heat transfer member 700 may be closely interposed between the display module 100 and the heat exchanger 200 to transfer heat received from the display module 100 to the heat exchanger 200 in a heat conduction method.

The heat transfer member 700 may remove air present between the display module 100 and the heat exchanger 200. Specifically, the air may interrupt transfer of heat, generated in the display module 100 or having passed through the display module 100, to the heat exchanger 200. The heat transfer member 700, in a state of being closely interposed between the display module 100 and the heat exchanger 200, may remove air present between the display module 100 and the heat exchanger 200 so as to efficiently transfer heat generated in the display module 100 or having passed through the display module 100 to the heat exchanger 200.

The heat transfer member 700 may include at least one of a thermal pad and a metal member. For example, the thermal pad may include a thermally conductive resin layer and a thermally conductive metal layer. In this regard, the thermally conductive resin layer may include silicon. In addition, the thermally conductive metal layer may include a metal filler such as aluminum. However, types of the thermal pad are not limited to the above-described examples. For example, the metal member may include aluminum. However, types of the metal member are not limited to aluminum.

The display device 1 may further include a controller 300. The controller 300 may be disposed inside the housing 10 to drive the display module 100.

The controller 300 may be implemented using a memory (not shown) that stores data on algorithms to control the operation of elements of the display device 1 or programs to run the algorithms and a processor (not shown) to perform the above-described operation using the data stored in the memory. In this regard, the memory and the processor may be implemented using separate chips. Alternatively, the memory and the processor may be integrated into a single chip or a plurality of chips.

The controller 300 may be arranged on a substantially straight line with the heat exchanger 200 in a vertical direction H of the display device 1. As such, by aligning the controller 300 and the heat exchanger 200 on a straight line in the vertical direction H of the display device 1, the display device 1 may be implemented in a slimmer design. Also, the display device 1 may be implemented to have a uniform thickness in the vertical direction H.

The controller 300 may be arranged below the heat exchanger 200. However, the position of the controller 300 is not limited to the position below the heat exchanger 200 as long as the controller 300 is aligned on a substantially straight line with the heat exchanger 200 in the vertical direction H of the display device 1. That is, the controller 300 may also be disposed above the heat exchanger 200.

The controller 300 may include a circuit board 310.

The controller 300 may further include at least one electric component 320 mounted on the circuit board 310. The at least one electric component 320 may include a CPU, an SMPS, an LD, or the like which perform functions while exchanging information.

The circuit board 310 may be disposed at the rear surface of the display module 100. The circuit board 310 may be closely disposed to the rear surface of the display module 100. Alternatively, the circuit board 310 may be disposed to be slightly spaced apart from the display module 100 via a separate coupling member. Alternatively, the circuit board 310 may be positioned at the rear surface of the display module 100 via the above-described heat transfer member 700. That is, the heat transfer member 700 may be interposed between the display module 100 and the circuit board 310.

As shown in FIGS. 2 and 3, a blower 600 may be disposed to circulate internal air and flow external air in the housing 10. The blower 600 may be disposed inside a cooling flow path in which internal air circulates and external air flows. The blower 600 may be disposed in the cooling flow path in which internal air circulates and external air flows to generate internal air circulation and an external air flow. Furthermore, the blower 600 may determine a circulation direction of internal air and a flow direction of external air.

The blower 600 may include a first blower 610 and a second blower 620.

The first blower 610 may be located in the first cooling flow path P1. The first blower 610 located in the first cooling flow path P1 may generate internal air circulation. The second blower 620 may be located in the second cooling flow path P2. The second blower 620 located in the second cooling flow path P2 may generate an external air flow.

The blower 600 may include a motor (not shown) and a fan (not shown). The motor (not shown) and the fan (not shown) may be applied to the first blower 610 or the second blower 620 in the same manner. The blower 600 may be provided in plural. In other words, the first blower 610 may be provided in plural and the second blower 620 may also be provided in plural.

The motor (not shown) may be an AC motor (alternating current) or a DC motor (direct current) according to the type of input voltage. In the case of using a DC motor as the motor of the blower 600, a Brushless DC (BLDC) motor may be applied thereto. Unlike a general DC motor including brushes that connect an inner circuit to an external circuit of the motor, the brushes may be omitted from the BLDC motor. Thus, compared to the DC motor including brushes, noise may be lowered and durability reduction caused by fraction may be prevented in the BLDC motor because the structure has no physical contact.

As the DC motor, an EC motor may also be applied to the motor (not shown). The EC motor is a BLDC motor equipped with a device configured to receive a control signal from the outside. Also, the motor (not shown) may be provided as a reversible motor.

Therefore, the controller 300 may control the rotation direction of the motor M based on temperature measurement information obtained by a plurality of temperature sensors S which will be described below to invert the circulation direction of internal air and the flow direction of external air.

The blower 600 may be provided to have a structure in which the front and rear are open with respect to the fan. Therefore, the internal air circulation or flowing external air may pass through the blower 600.

The blower 600 may be fixed to a blower fixing plate 500 as shown in FIG. 3 and FIGS. 5 to 8. A shape of the blower fixing plate 500 may be applied identically or similarly to the first blower 610 or the second blower 620, and only the position where the blower fixing plate 500 is located in the housing 10 may vary. Alternatively, the shape of the blower fixing plate 500 mounted with the first blower 610 or the second blower 620 may also vary.

Hereinafter, referring to FIG. 3 and FIGS. 5 to 7, the case where the shape of the blower fixing plate 500 is applied identically or similarly to the first blower 610 or the second blower 620 will be described in detail.

As shown in FIG. 6, the blower fixing plate 500 may be formed using a single plate bent multiple times. The blower fixing plate 500 may include a blower mount 530, a first fixing flange 510, and a second fixing flange 520. The blower mount 530, the first fixing flange 510, and the second fixing flange 520 may be formed of a single plate bent multiple times.

The blower mount 530 may be formed to have a hole to which the blower 600 penetrating therethrough is fixed. The blower mount 530 may have a plurality of holes. A plurality of blowers 600 may be mounted on the holes, respectively. The blower 600 is provided in a structure having open front and open back as described above. The internal air circulation or the external air flow may pass through the blower 600 and flow. As a result, the internal air circulation or the external air flow may pass through the plurality of holes of the blower fixing plate 500 and flow.

Referring to FIG. 3 and FIGS. 5 to 7, the blower mount 530 may be disposed more precisely in a structure inclined with respect to the display module 100. Because the blower mount 530 is disposed to be inclined with respect to the display panel 110, the blower 600 mounted on the blower mount 530 may also be disposed to be inclined with respect to the display panel 110.

An inclined plane of the blower mount 530 on which the first blower 610 is mounted may be formed to be inclined downward to face a position where the heat exchanger 200 is located. A width of the inclined plane of the blower mount 530 mounted with the first blower 610 may be formed to correspond to a width of the first frame 30 in the lateral direction W.

Figure 9:
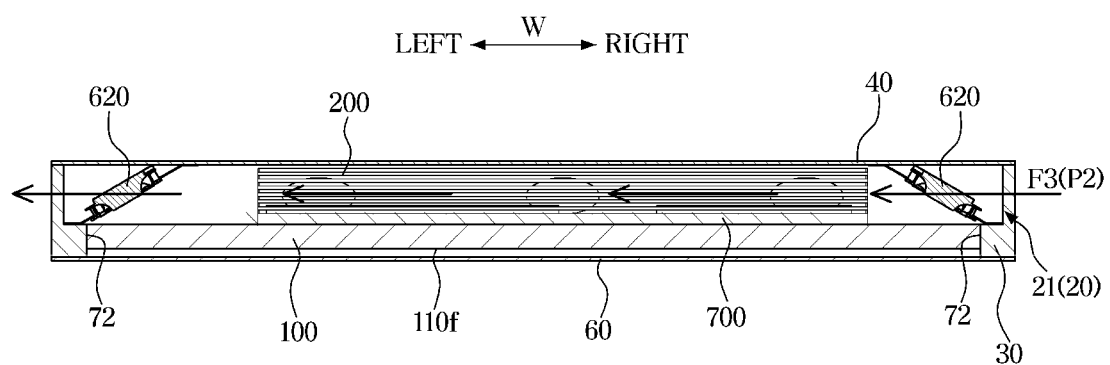
FIG. 9 is a cross-sectional view taken along line B-B' shown in FIG. 4.

A width of each of the first fixing flange 510 and the second fixing flange 520 may be formed to correspond to a width of the first frame 30 in the lateral direction W. The first fixing flange 510 may be fixed to the rear surface of the display module 100. The first fixing flange 510 may be closely fixed to the rear surface of the display module 100. Alternatively, as shown in FIG. 9, the first fixing flange 510 may be fixed directly to the first frame 30. The second fixing flange 520 may be fixed to the rear cover 40.

The width of the inclined plane of the blower mount 530 may be formed to correspond to a width of the first frame 30 in the lateral direction W. In other words, as shown in FIG. 4, both ends of the blower fixing plate 500 on which the first blower 600 is mounted may be in contact with inner surfaces of the first frame 30 at contact points 530*a*.

Therefore, the inner space of the housing 10 facing the rear surface of the blower mount 530 is separated from the inner space of the housing 10 facing the front surface of the blower mount 530 by the blower mount 530, and they are in communication with each other only through the plurality of holes. Based on this structure, efficiency of the motor of the blower 600 may be increased.

The inclined plane of the blower mount 530 mounted with the second blower 620 may be formed to be inclined downward to face the vent 20 formed at the first frame 30. A width of the inclined plane of the blower mount 530 mounted with the second blower 620 may be formed to correspond to a width of the first frame 30 having the vent 20 in the vertical direction H. Alternatively, the embodiment is not limited thereto, the width of the inclined plane may be formed wider than the width of the first frame 30 having the vent 20 in the vertical direction H.

Referring to FIGS. 2 and 3, the blower fixing plate 500 mounted with the second blower 620 may be supported by a guide flange 31 protruding from the inner side surface of the first frame 30. Specifically, the blower mount 530 mounted with the second blower 620 may be supported by the guide flange 31 protruding from the inner side surface of the first frame 30.

The vent 20 may be formed at both sides of the first frame 30 as described above. The guide flange 31 may protrude toward the inside of the housing 10 from the inner side surface of the first frame 30 at positions corresponding to the opposite ends of the vent 20. In other words, a plurality of slits may be formed at a region of the first frame 30 between a pair of guide flanges 31. In this regard, a vent 20 formed on the right side of the first frame 30 may be defined as the first vent 21, and a vent 20 formed on the left side of the first frame 30 may be defines as the second vent 22.

Because the guide flanges 31 protrude to correspond to both ends of the vent 20, the guide flanges 31 may be provided in pair. A pair of guide flanges 31 may protrude from the left inner side surface of the first frame 30 among the inner side surfaces and a pair of guide flanges 31 may protrude from the right inner side surface thereof. Each pair of guide flanges 31 may support both ends of each blower fixing plate 500. In other words, as shown in FIG. 4, both ends of the blower fixing plate 500 mounted with the second blower 620 may be in contact with the guide flange 31 at contact points 530*b*.

Figure 7:
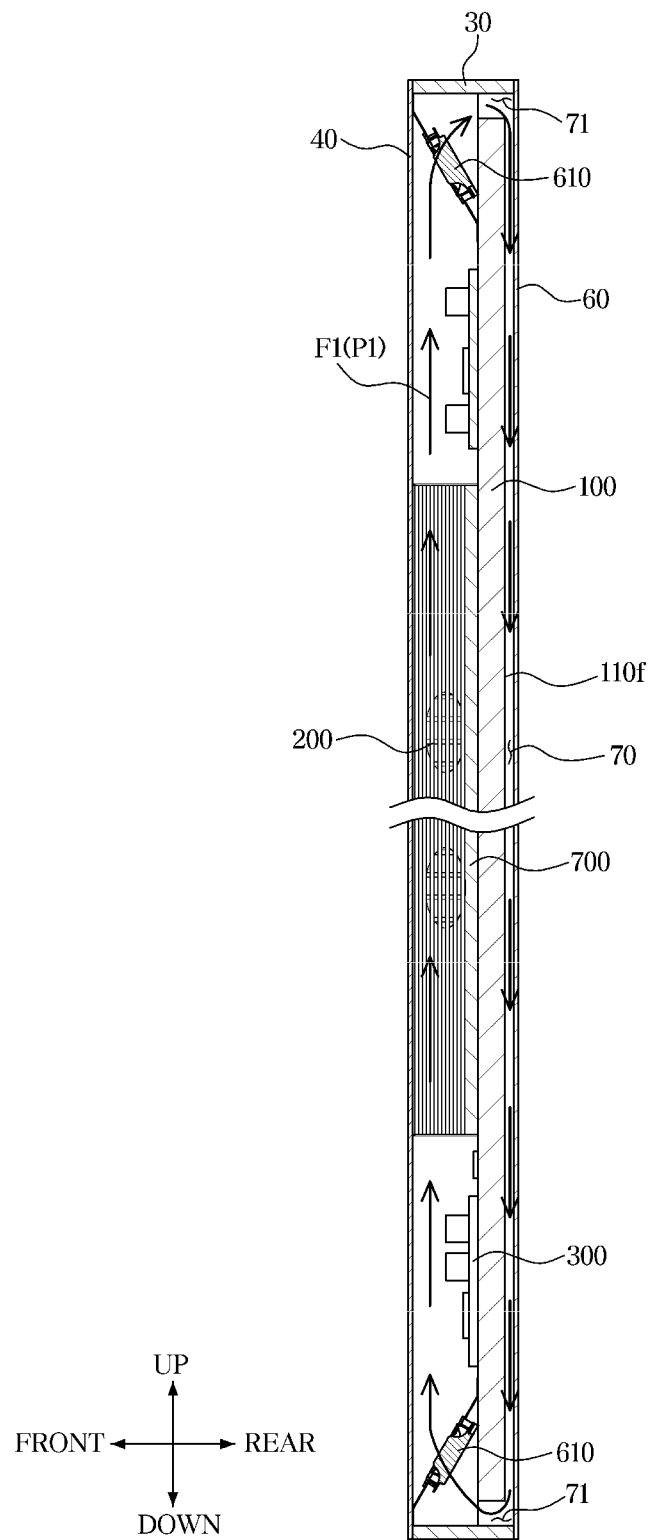
FIG. 7 is a cross-sectional view taken along line A-A shown in FIG. 4.
Figure 8:
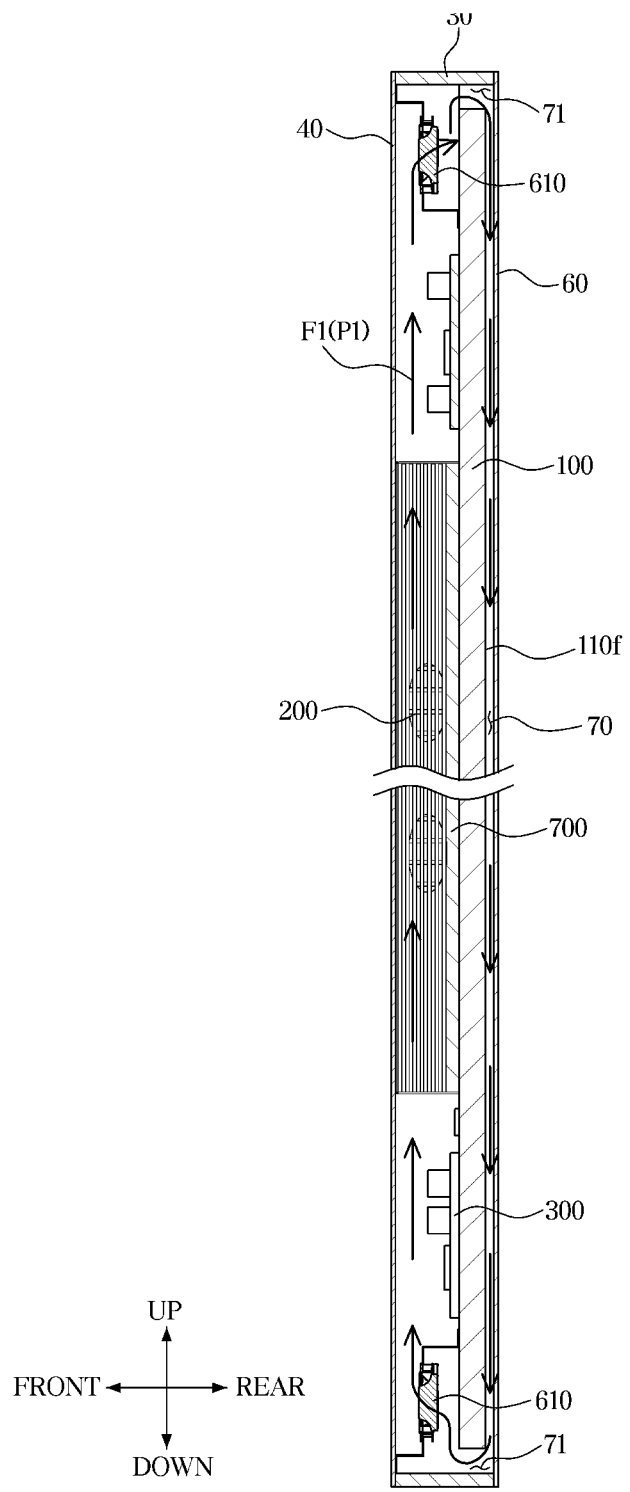
FIG. 8 is a cross-sectional view taken along line A-A' shown in FIG. 5 in a display device according to another embodiment of the present disclosure.
Figure 10:
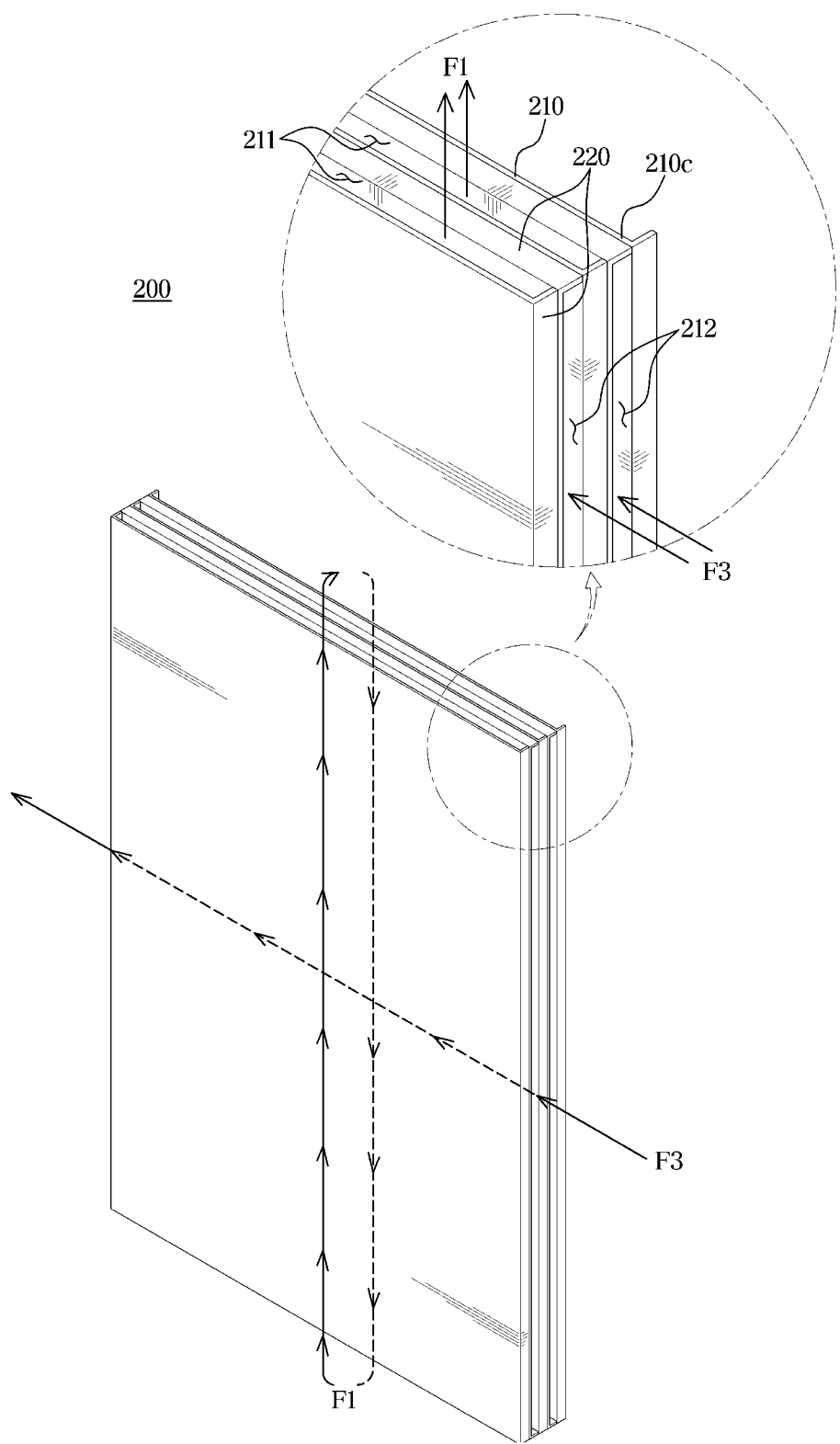
FIG. 10 is a perspective view of a stack structure of heat exchange fins of a heat exchanger of FIG. 2 and an enlarged view of a corner thereof.

FIG. 7 is a cross-sectional view taken along line A-A shown in FIG. 4. FIG. 8 is a cross-sectional view taken along line A-A shown in FIG. 5 in a display device according to another embodiment of the present disclosure. FIG. 9 is a cross-sectional view taken along line B-B' shown in FIG. 4. FIG. 10 is a perspective view of a stack structure of heat exchange fins of a heat exchanger of FIG. 2 and an enlarged view of a corner thereof.

Hereinafter, a first cooling flow path P1 and a second cooling flow path P2 and a first airflow F1 to a fourth airflow F4 will be described in detail with reference to FIGS. 3 and 4 and FIGS. 7 to 9.

Referring to FIGS. 7 and 8, the first cooling flow path P1 may be defined as a cooling flow path in which internal air, which exchanges heat with the display module 100 while passing by the front surface of the display panel 110, circulates.

Specifically, the first cooling flow path P1 may be defined as a space sequentially including the following spaces. The first cooling flow path P1 may include an inner space of the housing 10 located between the guide flange 31 and the blower fixing plate 500 disposed at an upper portion. The first cooling flow path P1 may include an inner space of the housing 10 located between the blower fixing plate 500 located at an upper end and the first frame. The first cooling flow path P1 may include an upper space 71 that is a space 70 between the first frame 30 and the display module 100. The first cooling flow path P1 may include a space 70 between the front surface 110f of the display panel and the protective glass 60. The first cooling flow path P1 may include a lower space 71 that is a space 70 between the first frame 30 and the display module 100. The first cooling flow path P1 may include an inner space of the housing 10 located between the blower fixing plate 500 located at a lower portion and the first frame 30. The first cooling flow path P1 may include an inner space of the housing 10 located between the guide flange 31 and the blower fixing plate 500 located at a lower end. The first cooling flow path P1 may include a first channel 211 of the heat exchanger 200. In other words, the first channel 211 of the heat exchanger 200 may constitute a part of the first cooling flow path P1.

The airflow circulating in the housing 10 and flowing in the above-described first cooling flow path P1 may be defined as 'internal air circulation'. As a part of the internal air circulation, a first airflow F1 may be defined as follows.

The first airflow F1 may be generated by the first blower 610. The first airflow F1 may start from the first blower 610 disposed at an upper portion of the display device 1. Then, the first airflow F1 may pass through the upper space 71 as a space between the first frame 30 and the display module 100. Then, the first airflow F1 may pass through the space 70 between the front surface 110f of the display panel and the protective glass 60. Then, the first airflow F1 may pass through the lower space as a space between the first frame 30 and the display module 100. Then, the first airflow F1 may pass through the first blower 610 located at a lower portion of the display device 1. Then, the first airflow F1 may pass through the inner space of the housing 10 located between the guide flange 31 and the blower fixing plate 500 disposed at a lower portion. Then, the first airflow F1 may pass through the first channel 211 of the heat exchanger 200. Then, the first airflow F1 may pass through the inner space of the housing 10 located between the guide flange 31 and the blower fixing plate 500 disposed at an upper portion. The first airflow F1 may pass through the first blower 610 disposed at the upper portion of the display device 1 again to form airflow circulation that circulates the periphery of the display module 100.

A second airflow F2 may be defined as an airflow that circulates in the opposite direction to the above-described first airflow F1. The second airflow F2 may be generated by rotating the fan of the first blower 610 that generates the first airflow F1 in the opposite direction to the rotation direction generating the first airflow F1. A method of controlling the rotation direction of the first blower 610 will be described in detail below.

Referring to FIG. 9, the second cooling flow path P2 may be defined as a cooling flow path in which external air, which exchanges heat with the first cooling flow path P1 in the heat exchanger 200, flows.

Specifically, the second cooling flow path P2 may be defined as a space sequentially including the following spaces.

The second cooling flow path P2 may include an inner space of the housing 10 defined by a side wall of the first frame 30 having the first vent 21, a pair of guide flanges 31 and a right blower fixing plate 500 mounted with the second blower 620. The second cooling flow path P2 may include an inner space of the housing 10 located between the right blower fixing plate 500 mounted with the second blower 620 and the right side surface of the heat exchanger 200. The second cooling flow path P2 may include a second channel 212 of the heat exchanger 200. The second cooling flow path P2 may include an inner space of the housing 10 located between a left blower fixing plate 500 mounted with the second blower 620 and the left side surface of the heat exchanger 200. The second cooling flow path P2 may include an inner space of the housing 10 defined by a side wall of the first frame 30 having the second vent 22, a pair of guide flanges 31, and a left blower fixing plate 500 mounted with the second blower 620. In other words, the second channel 212 of the heat exchanger 200 may constitute a part of the second cooling flow path P2.

An airflow that flows in the housing 10 and in the above-described second cooling flow path P2 may be defined as 'external air flow'. A third airflow F3 as a part of the external air flow may be defined as follows.

The third airflow F3 may be generated by the second blower 620. The third airflow F3 may start from the second blower 620 disposed at a right portion of the display device 1 as external air is introduced from the outside through the first vent 21. Then, the third airflow F3 may pass through the second blower 620 located at a right portion of the display device 1. Then, the third airflow F3 may pass through the inner space of the housing 10 located between the right blower fixing plate 500 mounted with the second blower 620 and the right side surface of the heat exchanger 200. Then, the third airflow F3 may pass through the second channel 212 of the heat exchanger 200. Then, the third airflow F3 may pass through the inner space of the housing 10 located between the left blower fixing plate 500 mounted with the second blower 620 and the left side surface of the heat exchanger 200. Then, the third airflow F3 may pass through the second blower 620 located at a left portion of the display device 1. Then, the third airflow F3 may flow out of the housing 10 through the second vent 22.

A fourth airflow F4 may be defined as an airflow that flows in the opposite direction to the above-described third airflow F3. The fourth airflow F4 may be generated by rotating the fan of the second blower 620 that generates the third airflow F3 in the opposite direction to the rotation direction generating the third airflow F3. A method of controlling the rotation direction of the second blower 620 will be described in detail below.

Regions where heat is exchanged between the above-describe first cooling flow path P1 and second cooling flow path P2 and first airflow F1 to fourth airflow are described below.

The first airflow F1 or the second airflow F2 flowing in the first cooling flow path P1 may exchange heat with the front surface 110f of the display panel 110. The first airflow F1 and the second airflow F2 flowing in the first cooling flow path P1 may exchange heat with the controller 300 located at the rear surface of the display module 100.

The first airflow F1 or the second airflow F2 flowing in the first cooling flow path P1 may exchange heat with the third airflow F3 or the fourth airflow F4 flowing in the second cooling flow path P2 at the heat exchanger 200 via the heat exchange fins 210.

Also, the heat transfer member 700 may exchange heat with the heat exchanger 200. The heat transfer member 700 may transfer heat generated at the rear surface of the display module 100 to the heat exchanger 200.

The first channel 211 constitutes a part of the first cooling flow path P1 and the second channel 212 constitute a part of the second cooling flow path P2 as described above. For efficient heat exchange between the first airflow F1 or the second airflow F2 flowing in the first channel 211 and the third airflow F3 or the fourth airflow F4 flowing in the second channel 212, the first channel 211 and the second channel 212 may intersect each other.

A structural relationship between the first channel 211 and the second channel 212 will be described in detail with reference to FIG. 10.

The heat exchanger 200 may include a plurality of heat exchange fins 210 that partition the first channel 211 and the second channel 212 such that the first channel 211 and the second channel 212 intersect each other. Each of the heat exchange fins 210 may be formed to have a C-shaped cross-section.

The heat exchange fins 210 may be staked and coupled to each other after rotating at 90° to form the heat exchanger.

Because the heat exchange fins 210 each having the C-shaped cross-section are stacked, channels may be formed between the heat exchange fins 210. In addition, the heat exchange fins 210 are stacked at 90° respectively, and thus directions of the formed channels also intersect with each other at 90°. The direction where the channel is formed may be defined in the same sense as the direction of the airflow flowing in the channel.

Therefore, the plurality of heat exchange fins 210 may partition the first channel 211 and the second channel 212 such that the first channel 211 and the second channel 212 intersect each other. As shown in FIG. 10, the heat exchanger 200 may achieve efficient heat exchange effects by using the structure in which the first airflow F1 or the second airflow F2 flowing in the first channel 211 is not mixed with the third airflow F3 or the fourth airflow F4 flowing in the second channel 212.

Figure 11:
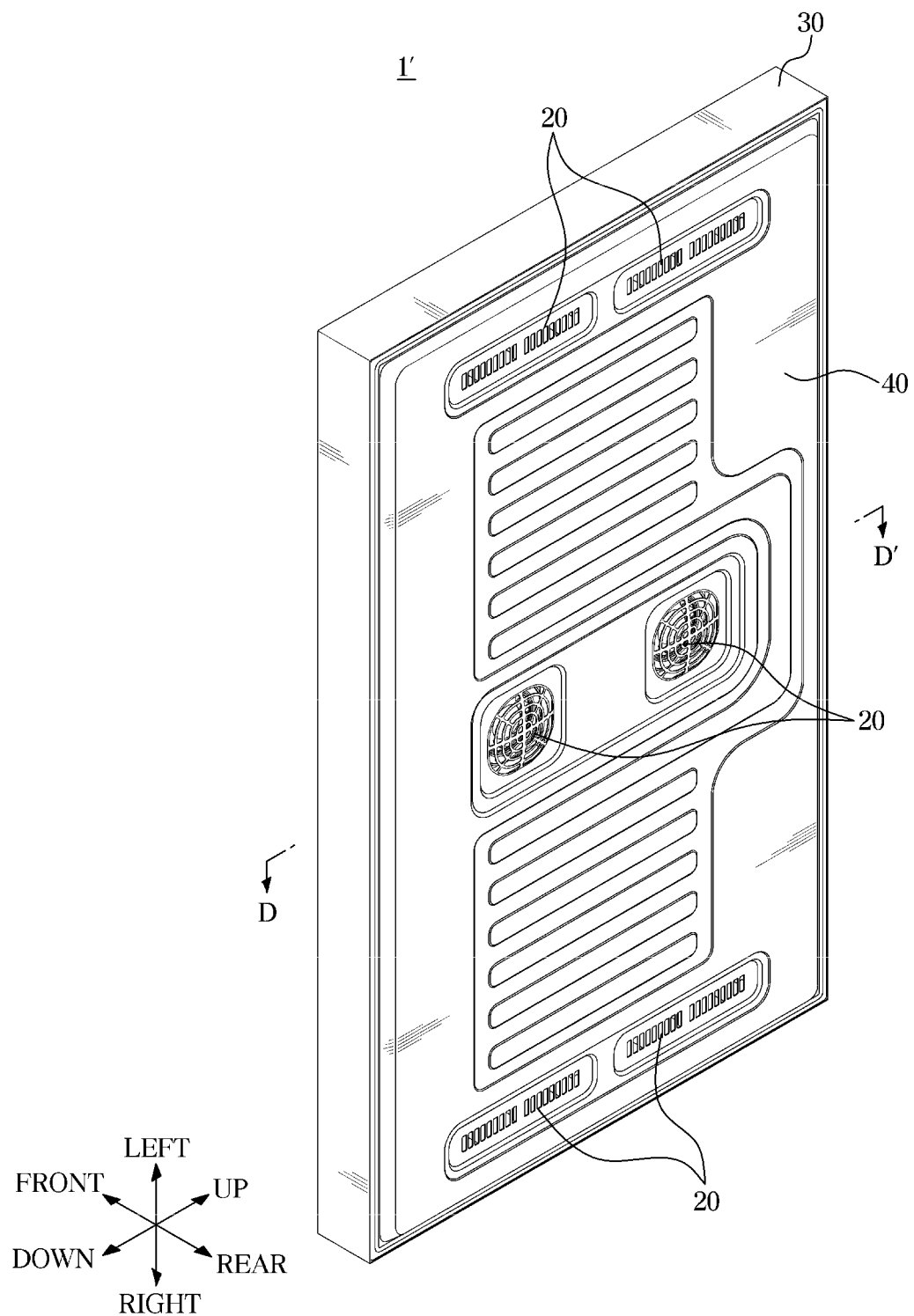
FIG. 11 is a rear perspective view of a display device according to another embodiment of the present disclosure.
Figure 12:
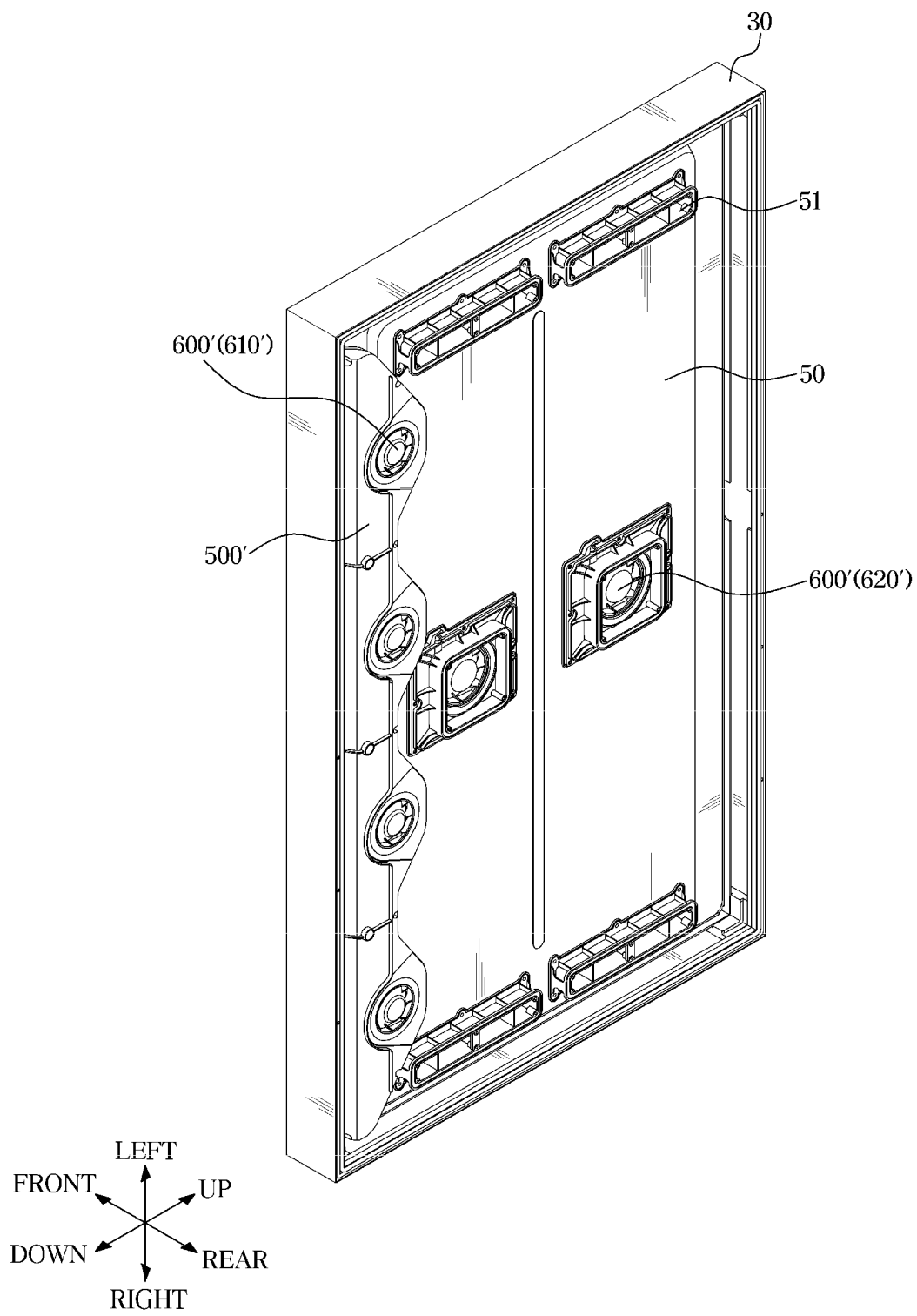
FIG. 12 is a rear perspective view of the display device shown in FIG. 11 from which a rear cover is removed.
Figure 13:
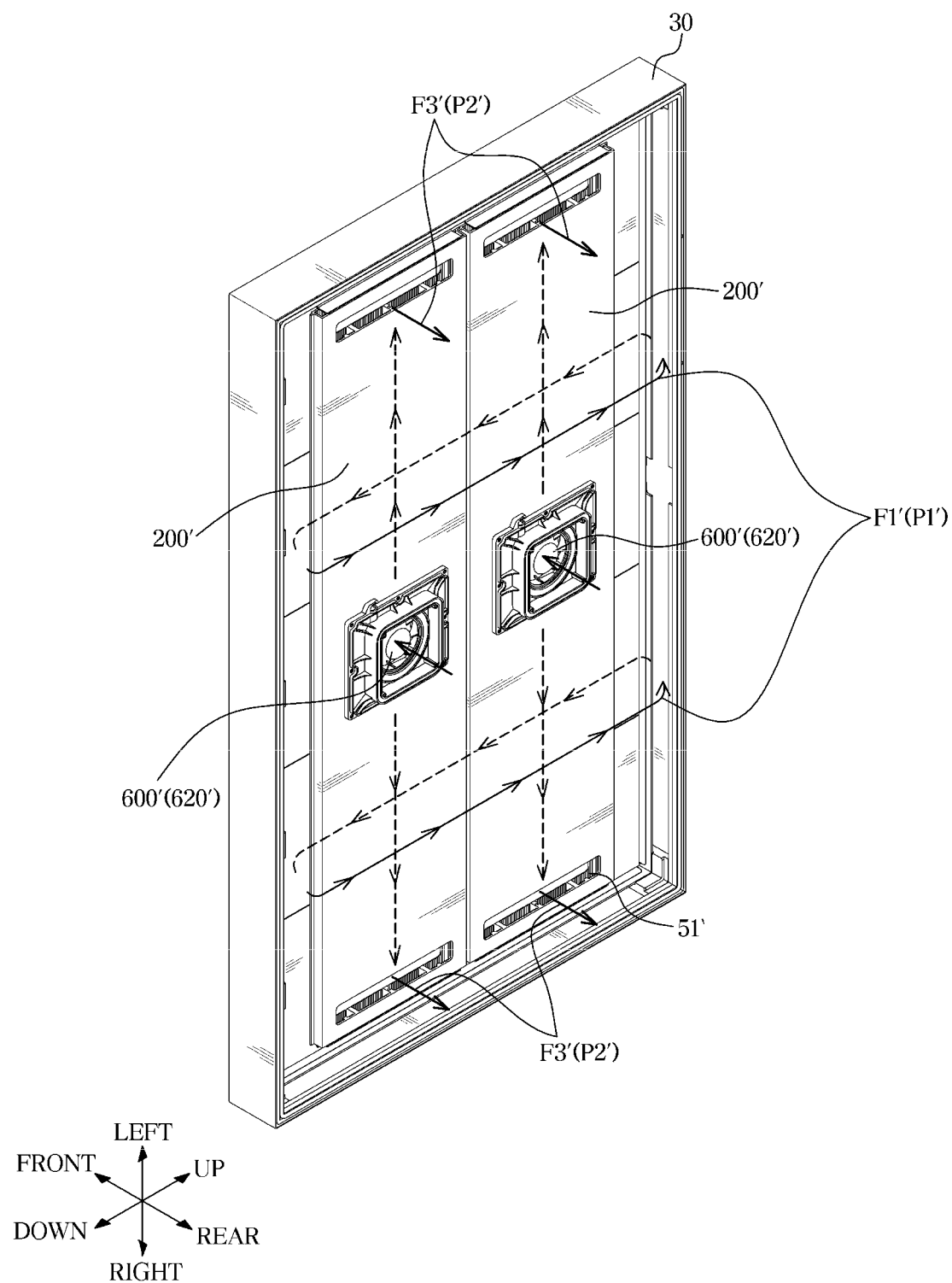
FIG. 13 is a rear perspective view of the display device shown in FIG. 12 from which a rear chassis and a guide bracket are removed.
Figure 14:
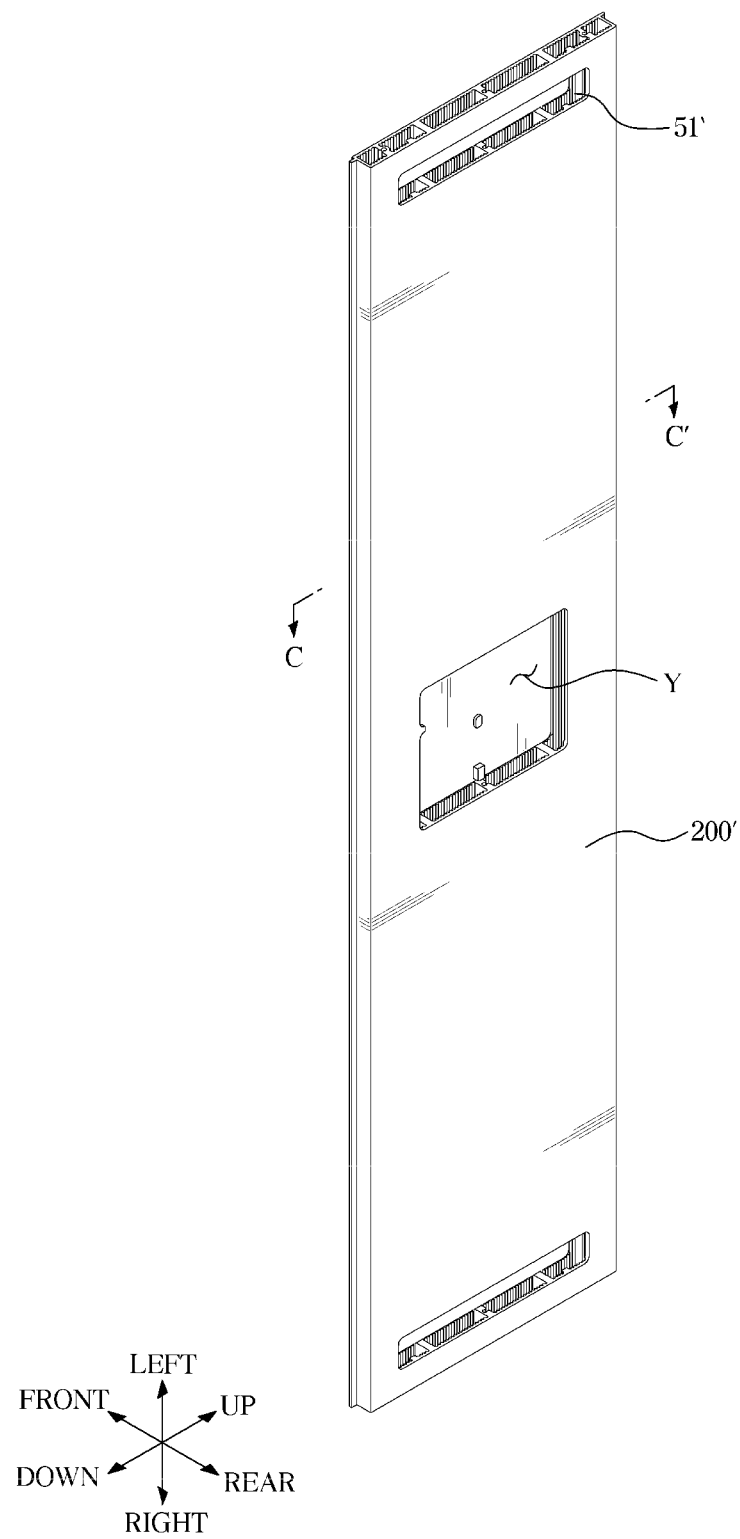
FIG. 14 is a perspective view of a heat exchanger of FIG. 13.
Figure 15:
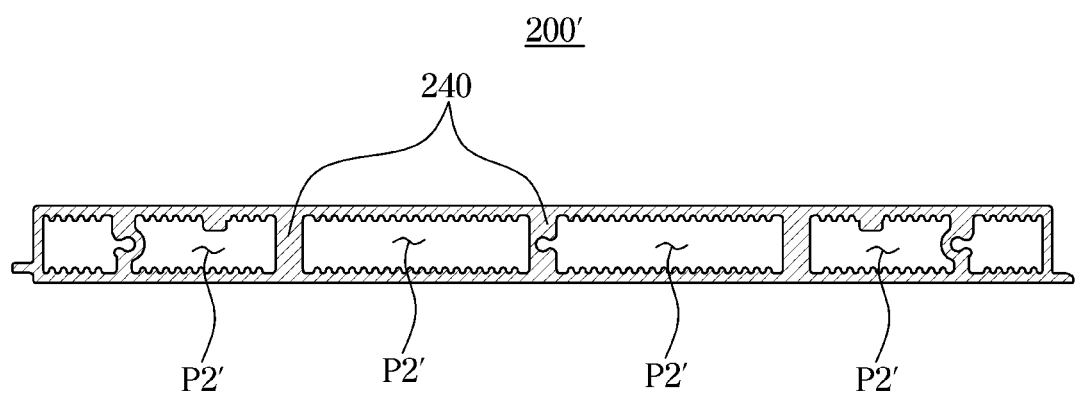
FIG. 15 is a cross-sectional view taken along line C-C' shown in FIG. 14.
Figure 16:
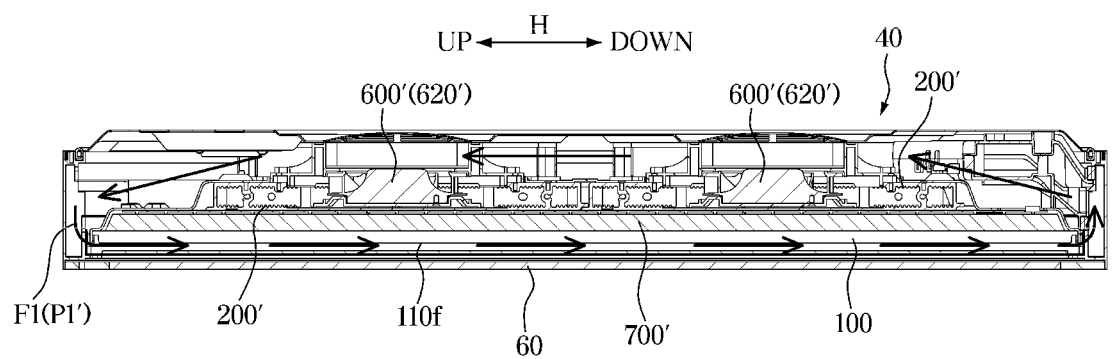
FIG. 16 is a cross-sectional view taken along line D-D' of FIG. 11.

FIG. 11 is a rear perspective view of a display device according to another embodiment of the present disclosure. FIG. 12 is a rear perspective view of the display device shown in FIG. 11 from which a rear cover is removed. FIG. 13 is a rear perspective view of the display device shown in FIG. 12 from which a rear chassis and a guide bracket are removed. FIG. 14 is a perspective view of a heat exchanger of FIG. 13. FIG. 15 is a cross-sectional view taken along line C-C' shown in FIG. 14. FIG. 16 is a cross-sectional view taken along line D-D' of FIG. 11.

Among the components of a display device 1' of FIGS. 11 to 16 according to another embodiment, descriptions thereof presented above will not be repeated herein and components will be described based on difference therebetween.

As illustrated in FIG. 11, in the display device 1' according to another embodiment, a vent 20 may be formed at a rear cover 40. Unlike the display device 1 according to the previous embodiment of the present disclosure in which the vent 20 is formed at both sides of the first frame 30 of the housing 10, the vent 20 may be formed at the rear surface of the display device 1'.

As illustrated in FIG. 12, in the display device 1' according to the current embodiment, a heat exchanger 200' may be covered with a second frame 50. Based on this structure, a first cooling flow path P1' in which internal air circulates may be formed between the front surface of the second frame 50 and the heat exchanger 200. In this regard, the first blower 610 that generates circulation of the internal air of the first cooling flow path P1' may be disposed in a state of being accommodated in a blower housing 500' as shown in FIG. 12. The blower housing 500' may constitute the first cooling flow path P1' together with the second frame 50.

Referring to FIG. 13, the display device 1' according to the current embodiment of the present disclosure may include a blower 600'. The blower 600' may include a first blower 610' and a second blower 620'.

The second blower 620' that generates an external air flow may be disposed at the center of the rear surface of the display module 100. As described above, the first blower 610' may form the first cooling flow path P1' in which the internal air circulates between the front surface of the second frame 50 and the heat exchanger 200', and the second blower 620' may be fixed to a second blower mount Y formed at the center of the heat exchanger 200', which will be described below, to generate the external air flow.

Unlike the external air flow flowing from the left to right or from the right to left according to the previous embodiment of the present disclosure, in the display device 1' according to the current embodiment of the present disclosure, the external air introduced through the second blower 620' at the center of the heat exchanger 200' may flow to the left and right sides of the display device 1' respectively and then be discharged out backward from the display device 1' through discharge slits 51' formed at both ends of the heat exchanger 200'. Alternatively, the rotation direction of the second blower 620' may be inverted to flow the external air in the opposite direction to that of the above-described external air.

Referring to FIGS. 14 and 15, unlike the display device 1 according to the previous embodiment in which the plurality of heat exchange fins are staked to form the first channel 211 and the second channel 212, in the display device 1' according to the current embodiment, the heat exchanger 200'a may be formed in a plate-shaped cylinder having a hollow at the center. The hollow formed at the center of the heat exchanger 200' may serve as a second cooling flow path P2' in which an external air flows. A support rib 240 may be formed at the hollow to obtain rigidity of the heat exchanger 200'. In addition, in order to enlarge heat exchange areas, a heat exchange projection 230 may be formed at the inner surface of the heat exchanger 200'.

As shown in FIG. 16, a structure of the internal air circulation may be formed similarly to that of the display device 1 according to the previous embodiment of the present disclosure.

In order to efficiently cool the display panel 110 of the display module 100 during the internal air circulation process, a heat transfer member 700' may be disposed between the heat exchanger 200' and the display module 100. The heat transfer member 700' may be disposed closely to the rear surface of the display module 100.

Differences of the structure of internal air circulation between the display device 1' according to the current embodiment of the present disclosure and the display device according to the previous embodiment of the present disclosure are as follows.

In the structure of internal air circulation of the display device 1 according to the previous embodiment of the present disclosure, heat exchange between the internal air circulation and the external air flow may be conducted inside the heat exchanger 200. On the contrary, in the structure of internal air circulation of the display device 1' according to the current embodiment of the present disclosure, heat exchange between the internal air circulation and the external air flow may be conducted outside the heat exchanger 200'.

In the display device 1 according to the previous embodiment of the present disclosure, the heat exchanger 200 has the stack structure including a plurality of heat exchange fins 210 as shown in FIG. 10. On the contrary, in the display device 1' according to the current embodiment of the present disclosure, the heat exchanger 200' is formed in a plate-shaped cylinder having a hollow at the center.

Therefore, based on the above-described structural differences, a structure penetrating the rare surface of the heat exchanger 200' in which the internal air circulation exchanges heat with the external air flow may be formed as shown in FIG. 13.

Figure 17:
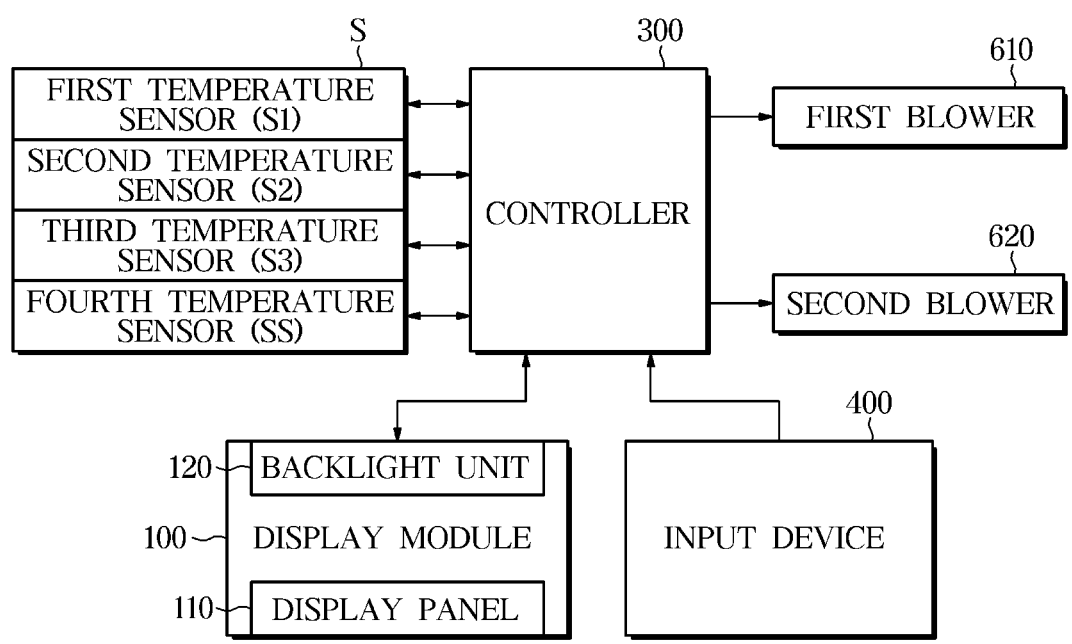
FIG. 17 is a control block diagram of the display device shown in FIG. 1.
Figure 18:
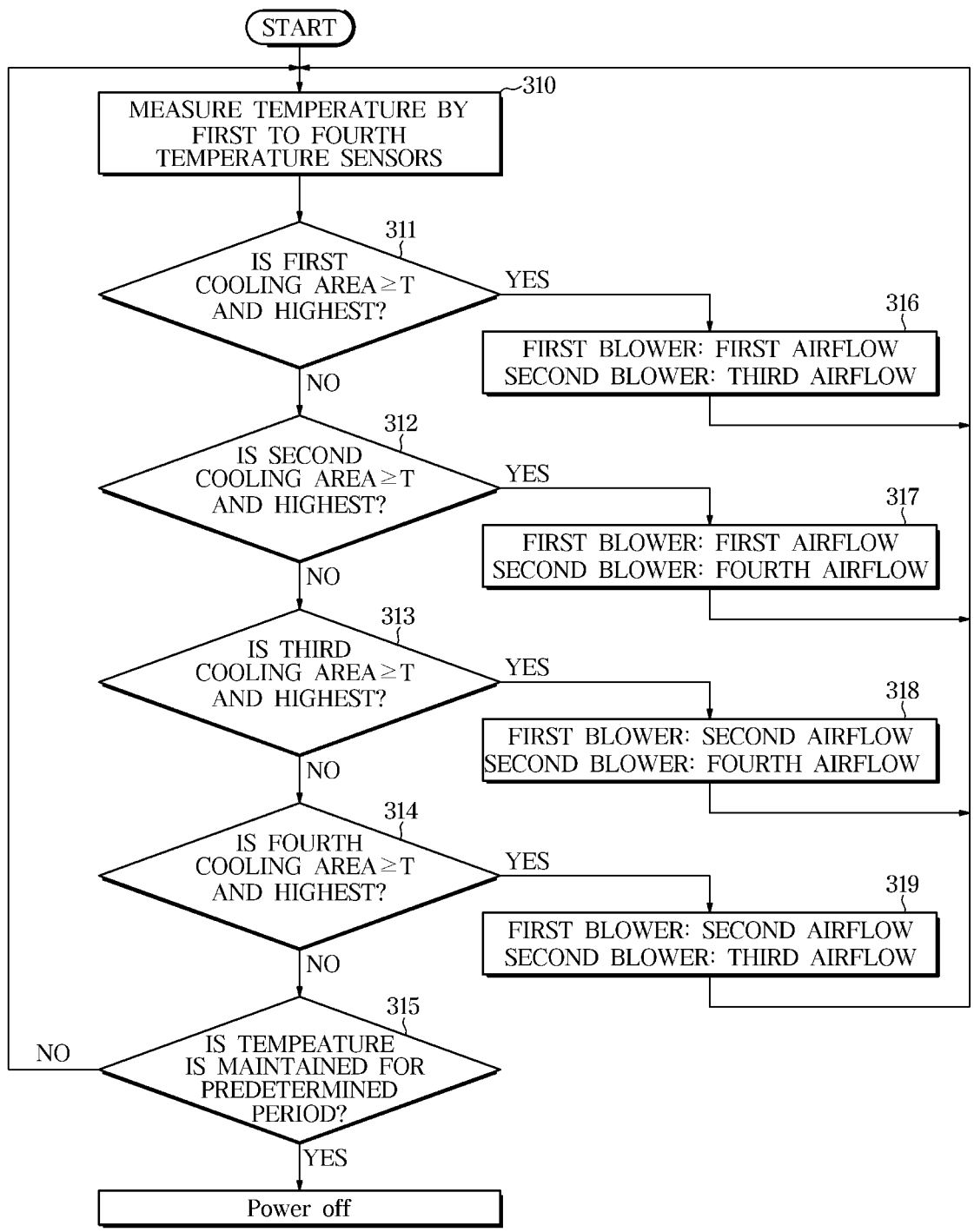
FIG. 18 is a flowchart illustrating an example of controlling a blower in accordance with internal temperature of the display device shown in FIG. 1 in a method of controlling the display device.

FIG. 17 is a control block diagram of the display device shown in FIG. 1. FIG. 18 is a flowchart illustrating an example of controlling a blower in accordance with internal temperature of the display device shown in FIG. 1 in a method of controlling the display device.

There is a need to adjust the directions of the internal air circulation and the external air flow to prevent sheet wrinkles, which is caused by deterioration of the display device 110, by uniformly cooling the entire area of the display module 100.

Hereinafter, a method for controlling the rotation direction of the fan of the first blower 610 or the second blower 620 will be described in detail with reference to FIGS. 3 and 4.

As shown in FIGS. 3 and 4, the internal region of the housing 10 may be divided into four quadrants based on the rear surface of the display panel 110. In this regard, the quadrants may be defined as first cooling area A1, second cooling area A2, third cooling area A3, and fourth cooling area A4 sequentially disposed in the counterclockwise direction from the area located at the upper right corner.

With respect to the quadrants, the first cooling flow path P1 may be formed parallel to the vertical direction of the quadrants. The second cooling flow path P2 may be formed parallel to the lateral direction of the quadrants. The first vent 21 and the second vent 22 may be formed at positions corresponding to both ends of the second cooling flow path P2 of the housing 10, respectively.

Temperature sensors S may be disposed in the respective areas to measure temperature of the first cooling area A1, the second cooling area A2, the third cooling area A3, and the fourth cooling area A4. The temperature sensor S may be provided in plural. The plurality of temperature sensors S may be disposed behind the display panel. A temperature sensor S disposed in the first cooling area A1 may be defined as a first temperature sensor S1, a temperature sensor S disposed in the second cooling area A2 may be defined as a second temperature sensor S2, a temperature sensor S disposed in the third cooling area A3 may be defined as a third temperature sensor S3, and a temperature sensor S disposed in the fourth cooling area A4 may be defined as a fourth temperature sensor S4.

Referring to FIGS. 3 and 4, each of the temperature sensors S may be disposed in the first cooling flow path P1 to efficiently measure the temperature of each area. More specifically, each temperature sensor S may be disposed in the inner space of the housing 10 located between the guide flange 31 and the blower fixing plate 500. However, the positions where the temperature sensors S are located are not limited to the above-described examples as long as the temperature sensors S are uniformly arranged in the first cooling area A1 to the fourth cooling area A4.

Referring to FIG. 17, temperature information measured by each temperature sensor S may be transmitted to the controller 300. The controller 300 controls the first blower 600 or the second blower 620 based on the temperature information measured by each temperature sensor S. Specifically, the controller 300 controls the rotation direction of the fan by using the motor of the first blower 600 or the second blower 620 based on the temperature information measured by each temperature sensor S to control a direction of the external air flow or a direction of internal air circulation. In addition, the controller 300 may control the operation of the backlight unit 120 of the display module 100 or control image display of the display panel 110. In addition, the controller 300 may control each of the components of the display device by processing information received from a user via an input device 400.

Referring to FIG. 18, a method for controlling the rotation direction of the fan of the first blower 610 or the second blower 620 will be described in detail.

The first temperature sensor S1 to the fourth temperature sensor S4 may measure temperature. Temperature information measured by each temperature sensor S may be transmitted to the controller 300 (Operation 310)

Upon determination that a temperature measured by the temperature sensor disposed in the first cooling area A1 is equal to or higher than an optimal temperature T and higher than temperatures measured by the other temperature sensors based on the measured temperature information (Operation 311), the controller 300 may control the first blower 610 to generate the first airflow F1 to flow in the first cooling flow path P1 and may control the second blower 620 to generate the third airflow F3 to flow in the second cooling flow path P2 (Operation 316).

In the case where the temperatures do not satisfy the control conditions of the above-described operations, a next operation may be performed. Upon determination that a temperature measured by the temperature sensor disposed in the second cooling area A2 is equal to or higher than an optimal temperature T and higher than temperatures measured by the other temperature sensors based on the measured temperature information (Operation 312), the controller 300 may control the first blower 610 to generate the first airflow F1 to flow in the first cooling flow path P1 and may control the second blower 620 to generate the fourth airflow F4 to flow in the second cooling flow path P2 (Operation 317).

In the case where the temperatures do not satisfy the control conditions of the above-described operations, a next operation may be performed.

Upon determination that a temperature measured by the temperature sensor disposed in the third cooling area A3 is equal to or higher than an optimal temperature T and higher than temperatures measured by the other temperature sensors based on the measured temperature information (Operation 313), the controller 300 may control the first blower 610 to generate the second airflow F2 to flow in the first cooling flow path P1 and may control the second blower 620 to generate the fourth airflow F4 to flow in the second cooling flow path P2 (Operation 318).

In the case where the temperatures do not satisfy the control conditions of the above-described operations, a next operation may be performed.

Upon determination that a temperature measured by the temperature sensor disposed in the fourth cooling area A4 is equal to or higher than an optimal temperature T and higher than temperatures measured by the other temperature sensors based on the measured temperature information (Operation 314), the controller 300 may control the first blower 610 to generate the second airflow F2 to flow in the first cooling flow path P1 and may control the second blower 620 to generate the third airflow F3 to flow in the second cooling flow path P2 (Operation 319).

In the case where the temperatures do not satisfy the control conditions of the above-described operations, a next operation may be performed. The next operation is performed in the case where all of the first cooling area A1 to fourth cooling area A4 are maintained below the optimal temperature T for a predetermined period of time, and the operation of the blower 600 may be stopped in the case.

The embodiments of the present disclosure have been shown and described above with reference to the accompanying drawings. However, the disclosed embodiments are illustrative and the scope of the present disclosure is not limited thereby. It will be understood by those of ordinary skill in the art that the present disclosure may be easily modified into other detailed forms without changing the technical principle or essential features of the present disclosure.

What is claimed is:

1. A display device comprising:
a housing including a first vent and a second vent;
a display panel inside the housing;
a first cooling flow path inside the housing;
a first blower configured to generate an airflow of internal air inside the housing that flows and recirculates along the first cooling flow path and that exchanges heat with the display panel;
a second cooling flow path inside the housing;
a second blower configured to generate an airflow of external air that is introduced into the housing through the first vent, then flows inside the housing along the second cooling flow path, and then flows out of the housing through the second vent; and
a heat exchanger inside the housing behind the display panel, wherein the heat exchanger includes a first channel in which a part of the first cooling flow path is formed and a second channel in which a part of the second cooling flow path is formed so that the airflow generated by the first blower exchanges heat with the airflow generated by the second blower while the airflow generated by the first blower flows in the part of the first cooling flow path formed in the first channel and the airflow generated by the second blower flows in the part of the second cooling flow path formed in the second channel.

2. The display device according to claim 1, wherein
an internal region of the housing, divided into four quadrants based on a rear surface of the display panel, includes a first cooling area, a second cooling area, a third cooling area, and a fourth cooling area sequentially disposed in a counterclockwise direction from an area located at an upper right corner of the internal region, and
the display device includes a first temperature sensor, a second temperature sensor, a third temperature sensor, and a fourth temperature sensor behind the display panel and located respectively in the first cooling area, the second cooling area, the third cooling area, and the fourth cooling area.

3. The display device according to claim 2, wherein the first cooling flow path is formed parallel to an up/down direction of the quadrants.

4. The display device according to claim 2, wherein the first blower is configured to generate the airflow of internal air so as to flow in a first direction along the first cooling flow path or in a second direction, opposite the first direction, along the first cooling flow path.

5. The display device according to claim 4, further comprising:
a cover glass in front of the display panel, spaced apart from the display panel, and coupled to the housing,
wherein the airflow of internal air, when flowing in the first direction along the first cooling flow path, circulating recirculates along the first cooling flow path in order of an upper end of a periphery of the display panel, a space between a front surface of the display panel and the cover glass, a lower end of the periphery of the display panel, and the first channel.

6. The display device according to claim 5, wherein the first blower is behind the display panel and is provided as a plurality of first blowers, and each first blower of the plurality of first blowers is close to the upper end of the periphery of the display panel or the lower end of the periphery of the display panel.

7. The display device according to claim 5, wherein the second blower is configured to generate the airflow of external air so as to flow in a first direction along the second cooling flow path or in a second direction, opposite to the first direction, along the second cooling flow path.

8. The display device according to claim 7, wherein the second cooling flow path is parallel to a lateral direction of the quadrants, and the first vent and the second vent are formed at positions corresponding to ends of the second cooling flow path of the housing, respectively.

9. The display device according to claim 8, wherein the first vent is on a side of the first cooling area or the fourth cooling area and the second vent is on a side of the second cooling area or the third cooling area, and the airflow of external air flowing in the first direction along the second cooling flow path flows from the first vent to the second vent through the second channel.

10. The display device according to claim 8, wherein the second blower is provided as a plurality of second blowers, and each second blower of the plurality of second blowers is close to at least one of the first vent and the second vent.

11. The display device according to claim 9, further comprising:
a controller inside the housing,
wherein the controller is configured to control the first blower to generate the airflow of internal air flowing in the first direction along the first cooling flow path and control the second blower to generate the airflow of external air in the first direction along the second cooling flow path upon determination that a temperature measured by the first temperature sensor is higher than temperatures measured by the second temperature sensor, the third temperature sensor, and the fourth temperature sensor.

12. The display device according to claim 9, further comprising:

a controller disposed inside the housing, wherein the controller is configured to control the first blower to generate the airflow of internal air flowing in the first direction along the first cooling flow path and control the second blower to generate the airflow of external air flowing in the second direction along the second cooling flow path upon determination that a temperature measured by the second temperature sensor is higher than temperatures measured by the first temperature sensor, the third temperature sensor, and the fourth temperature sensor.

13. The display device according to claim 9, further comprising:

a controller inside the housing, wherein the controller is configured to control the first blower to generate a the airflow of internal air flowing in the second direction along in the first cooling flow path and control the second blower to generate the airflow of external air flowing in the second direction along the second cooling flow path upon determination that a temperature measured by the third temperature sensor is higher than temperatures measured by the first temperature sensor, the second temperature sensor, and the fourth temperature sensor.

14. The display device according to claim 9, further comprising:

a controller inside the housing, wherein the controller is configured to control the first blower to generate the airflow of internal air flowing in the second direction along the first cooling flow path and control the second blower to generate the airflow of external air flowing in the first direction along the second cooling flow path upon determination that a temperature measured by the fourth temperature sensor is higher than temperatures measured by the first temperature sensor, the second temperature sensor, and the third temperature sensor.

15. The display device according to claim 1, wherein the heat exchanger includes a plurality of heat exchange fins partitioning the first channel and the second channel, each heat exchange fin of the plurality of heat exchange fins has a C-shaped cross-section, and the plurality of heat exchange fins are stacked and coupled to each other by rotating at 90° to constitute the heat exchanger, the housing further includes a guide flange partitioning the first cooling flow path and the second cooling flow path and supporting the heat exchanger, and the guide flange is configured to guide external air introduced through the first vent to the second channel and guide the external air flowing out of the second channel to be discharged through the second vent.

* * * * *